United States Patent
Wang

(10) Patent No.: US 9,343,458 B2
(45) Date of Patent: May 17, 2016

(54) ISOLATION STRUCTURE FOR ESD DEVICE

(71) Applicant: Taiwan Semiconductor Manufacturing Company Limited, Hsin-Chu (TW)

(72) Inventor: Chun-Kai Wang, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 89 days.

(21) Appl. No.: 13/661,776

(22) Filed: Oct. 26, 2012

(65) Prior Publication Data

US 2013/0119433 A1 May 16, 2013

Related U.S. Application Data

(63) Continuation-in-part of application No. 13/469,923, filed on May 11, 2012, now Pat. No. 8,525,300.

(60) Provisional application No. 61/540,887, filed on Sep. 29, 2011.

(51) Int. Cl.
| | |
|---|---|
| *H01L 29/735* | (2006.01) |
| *H01L 27/06* | (2006.01) |
| *H01L 27/02* | (2006.01) |

(52) U.S. Cl.
CPC ........ *H01L 27/0647* (2013.01); *H01L 27/0259* (2013.01); *H01L 29/735* (2013.01)

(58) Field of Classification Search
CPC ...... H01L 27/0259–27/0285; H01L 29/66234; H01L 29/73; H01L 29/735
See application file for complete search history.

(56) References Cited

U.S. PATENT DOCUMENTS

| | | | |
|---|---|---|---|
| 6,855,985 B2 * | 2/2005 | Williams et al. | 257/338 |
| 7,015,089 B2 | 3/2006 | Hsu et al. | |
| 7,719,026 B2 * | 5/2010 | Lou et al. | 257/173 |
| 2006/0220104 A1 * | 10/2006 | Fujiwara | 257/316 |
| 2010/0164012 A1 * | 7/2010 | Yoon | 257/370 |
| 2010/0320501 A1 * | 12/2010 | Gendron et al. | 257/173 |
| 2012/0069479 A1 * | 3/2012 | Lee | 361/56 |

OTHER PUBLICATIONS

"How to Define Anode and Cathode", 2004, pp. 1-5, http://www.av8n.com/physics/anode-cathode.htm.

* cited by examiner

*Primary Examiner* — Bryan Junge
(74) *Attorney, Agent, or Firm* — Cooper Legal Group, LLC

(57) ABSTRACT

Among other things, an electrostatic discharge (ESD) device is provided. The ESD device comprises a dielectric isolation structure that is formed between an emitter and a collector of the ESD device. During an ESD event, current flows from the emitter, substantially under the dielectric isolation structure, to the collector, to protect associated circuitry. The dielectric isolation structure is formed to a depth that is less than a depth of at least one of the emitter or the collector, or doped regions thereof, thereby decreasing a length of a current path from the emitter to the collector, because the current is not obstructed by the dielectric isolation structure. Accordingly, the ESD device can carry higher current during the ESD event because the shorter current path has less resistance than a longer path that would otherwise be traveled if the dielectric isolation structure was not formed at the shallower depth.

23 Claims, 21 Drawing Sheets

ISOLATION STRUCTURE FOR ESD DEVICE

PRIORITY DATA

The present application claims priority to U.S. Provisional Application Ser. No. 61/540,887, filed Sep. 29, 2011, the disclosure of which is incorporated herein by reference in its entirety. The present application claims priority to U.S. Non-provisional application Ser. No. 13/469,923, filed May 11, 2012, the disclosure of which is incorporated herein by reference in its entirety.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

Electrostatic discharge (ESD) is an important concern for ICs. If not handled properly, an ESD event can result in a high voltage that could damage components on the IC. To prevent such ESD damage, many modern day ICs are equipped with an ESD protection device. The ESD protection device is operable to divert electrical current away from other components on the IC during an ESD event, thereby protecting these components from being damaged by the ESD event. Unfortunately, existing ESD protection devices often suffer from drawbacks such as excessive chip area consumption, degraded performance for applications with noisy power, and lack of tunability which may result in circuit design problems.

Therefore, while existing ESD protection devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
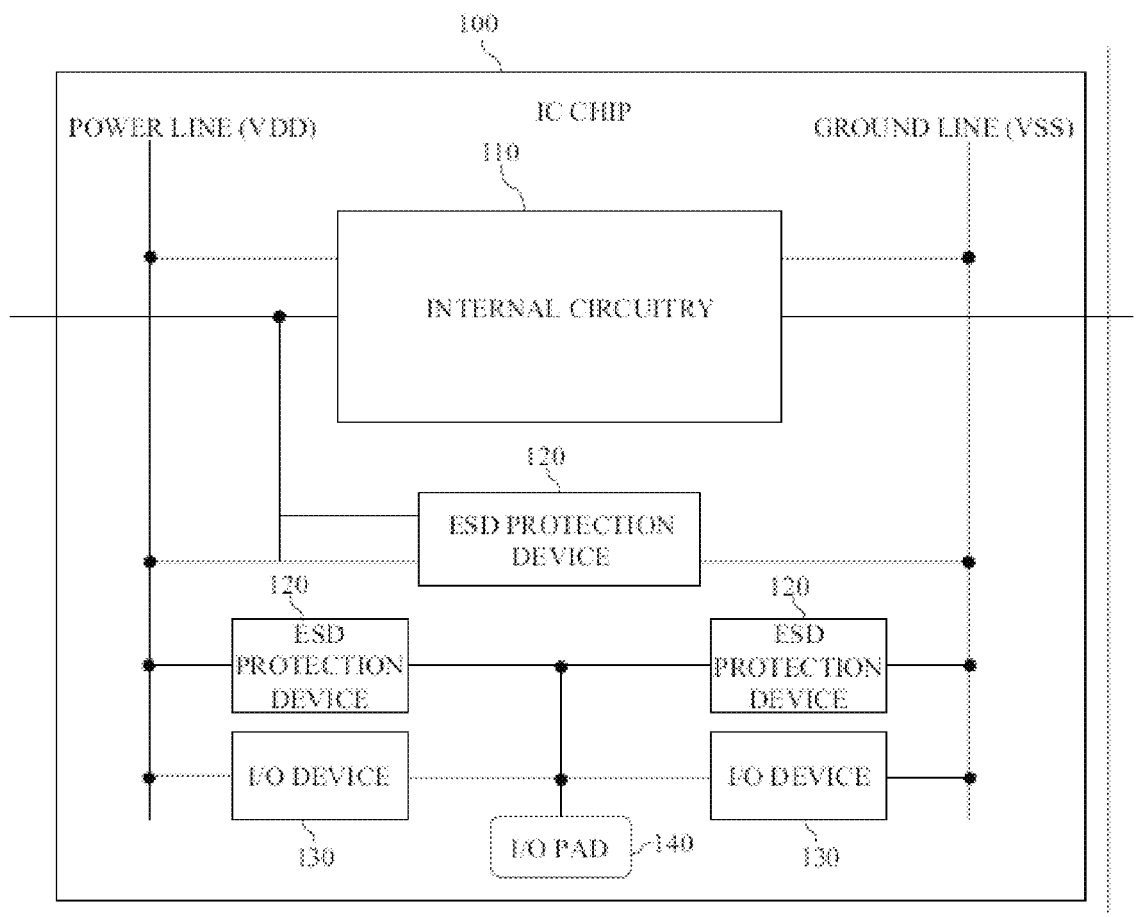
FIG. 1 is a simplified block diagram of an IC chip.

It is to be understood that the following disclosure provides many different embodiments, or examples, for implementing different features of the disclosed subject matter. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

There are many causes for an electrostatic discharge (ESD) event. For example, an ESD event may be trigged by static electricity, which is often generated simply by bringing two materials into contact and then separating them. Daily tasks such as hair combing or walking on carpet can be sources of static electricity. As another example, electrostatic induction can also trigger an ESD event. Electrostatic induction may occur when an electrically-floating conductive object and an electrically charged object are placed near each other.

When triggered, an ESD event may cause an excessively large amount of electrical current to flow through an IC chip, which can potentially damage internal circuitry on the IC chip. To protect the internal circuitry on the IC chip, various types of ESD protection devices are utilized to divert current away from the internal circuitry during an ESD event. One type of ESD protection device includes dynamically triggered Metal Oxide Semiconductor (MOS) devices (also referred to as RC-MOS ESD devices). However, these triggered MOS ESD protection devices typically consume a large amount of valuable chip area and are not best equipped to handle high voltage technology nodes or noisy applications. Another type of ESD protection device includes breakdown mode devices. These devices may be based on NMOS transistors, Bipolar Junction Transistors (BJTs), or Silicon Controlled Rectifiers (SCRs). Compared to RC-MOS ESD devices, the breakdown mode devices typically have smaller chip area consumption and reduced leakage performance. However, existing breakdown mode ESD protection devices lack tunability and may not meet design window specification limits.

According to various aspects of the present disclosure, an improved ESD protection device is provided that offers small chip area consumption, adjustable device characteristics by layout, a wider tuning range, and a latch-up free performance. In an embodiment, an ESD device comprises a dielectric isolation structure that isolates an emitter of the ESD device from a collector of the ESD device. The dielectric isolation structure with shallower depth enhances efficiency of the ESD device because current flows from one of the terminals, substantially under the dielectric isolation structure, to another terminal during an ESD event without substantial obstruction by the dielectric isolation structure. It is appreciated that in an embodiment, a terminal can comprise an emitter, a collector, a doped region, or any type of terminal. In an embodiment of the dielectric isolation structure, the dielectric isolation structure is formed to a depth, within a substrate upon which the ESD device is formed, that is relatively shallower than other dielectric isolation structures, such as shallow trench isolation (STI) or deep trench isolation. In this way, current flows substantially under the dielectric isolation structure along a relatively shorter path having a lower resistance than a longer path that would otherwise be traveled if the dielectric isolation structure was formed deeper within the substrate. Because the current flows along the shorter path with the lower resistance, the ESD device can handle a larger current before failure, such as failure resulting from a thermal event caused by high power dissipation.

According to some embodiments of the present disclosure, an ESD device comprises a first doped region formed within a substrate upon which the ESD device is formed. For example, the first doped region comprises a collector that is doped according to a first doping polarity. The ESD device comprises a second doped region formed within the substrate. For example, the second doped region comprises an emitter that is doped according to the first doping polarity. The first doped region and the second doped region are formed such that current flows from the second doped region to the first doped region during an ESD event. In an embodiment, the first doped region corresponds to an emitter of the ESD device. In an embodiment, the second doped region corresponds to a collector of the ESD device. A dielectric isolation structure is formed between the first doped region and the second doped region at a depth that is less than at least one of a first depth of the first doped region or a second depth of the second doped region. In an embodiment, the dielectric isolation structure is formed between the first doped region and the second doped region such that a bottom surface of the dielectric isolation structure is formed to a depth that is less than at least one of a depth of a bottom surface of the first doped region or a depth of a bottom surface of the second doped region. In an embodiment, a bottom surface of the dielectric isolation structure is formed to be substantially flush with a surface of the substrate, such as a silicon surface, for example. In an embodiment, the ESD device comprises a third doped region within the substrate. For example, the third doped region comprises a base for the ESD device. The third doped region is doped according to a second doping polarity that is different than the first doping polarity.

In an embodiment, the dielectric isolation structure comprises a resist protective oxide (RPO) layer. In an embodiment, the dielectric isolation structure does not comprise shallow trench isolation (STI). It may be appreciated that various types of isolation structures can be used for the dielectric isolation structure. In this way, current, flowing from the one of the doped regions to another doped region during an ESD event, flows substantially under the dielectric isolation structure. Because the dielectric isolation structure is formed at a relatively shallower depth, such as compared to the first doped region or the second doped region, current flows along a relatively short path from one of the doped regions to another doped region.

In an embodiment of the ESD device, the ESD device comprises a bipolar junction transistor (BJT). The first doped region of the BJT comprises a collector connected to lower voltage level, such as VSS, during normal operation. The second doped region of the BJT comprises an emitter connected to higher voltage level, such as VDD, during normal operation. During an ESD event, current flows from one of the terminals, substantially under the dielectric isolation structure, to another terminal. In an embodiment of the ESD device, the ESD device comprises a diode. The first doped region of the diode comprises an anode connected to lower voltage level, such as VSS, during normal operation. The second doped region of the diode comprises a cathode connected to higher voltage level, such as VDD, during normal operation. During an ESD event, current flows from one of the terminals, substantially under the dielectric isolation structure, to another terminal. In an embodiment of the ESD device, the ESD device comprises a silicon control rectifier. The first doped region of the silicon control rectifier comprises a cathode connected to lower voltage level, such as VSS, during normal operation. The second doped region of the silicon control rectifier comprises an anode connected to higher voltage level, such as VDD, during normal operation. During an ESD event, current flows from one of the terminals, substantially under the dielectric isolation structure, to another terminal. It may be appreciated that some embodiments of the ESD device are illustrated in FIGS. 2A and 2B.

According to some embodiments of the present disclosure, an apparatus comprises an ESD device. The ESD device comprises a collector formed within a substrate upon which the ESD device is formed. The collector comprises a first doped region that is doped according to a first doping polarity. The ESD device comprises an emitter formed within the substrate. The emitter comprises a second doped region that is doped according to the first doping polarity. The ESD device comprises a dielectric isolation region formed between the collector and the emitter. The dielectric isolation structure comprises a resist protective oxide (RPO) layer. The RPO layer is configured to provide isolation between the collector and the emitter. In an embodiment, the RPO layer is formed to a depth that is less than at least one of a first depth of the first doped region of the collector or a second depth of the second doped region of the emitter. In an embodiment, the RPO layer is formed on top of a surface of the substrate. In an embodiment, the RPO layer comprises a silicide blocking layer.

In an embodiment, the apparatus comprises an integrated circuit. The ESD device is operably coupled to the integrated circuit, such that the ESD device protects the integrated circuit from relatively high current during an ESD event that would otherwise damage the integrated circuit. In particular, the ESD device is configured to become active during the ESD event. While active, current flows from one of the terminals, substantially under the dielectric isolation region, to another terminal in order to divert the current away from the integrated circuit. It may be appreciated that some embodiments of the ESD device are illustrated in FIGS. 2A and 2B.

According to some embodiments of the present disclosure, an apparatus comprises an ESD device. The ESD device comprises a collector formed within a substrate upon which the ESD device is formed. The collector comprises a first doped region that is doped according to a first doping polarity. The ESD device comprises an emitter formed within the substrate. The emitter comprises a second doped region that is doped according to the first doping polarity. The ESD device comprises a dielectric isolation region formed between the collector and the emitter. The ESD device comprises a dielectric isolations structure. The dielectric isolation structure is formed on top of a surface of the substrate. The dielectric isolation structure is configured to provide isolation between the collector and the emitter. In an embodiment, the dielectric isolation structure comprises a resist protective oxide (RPO) layer. In an embodiment, the dielectric isolation structure does not comprise shallow trench isolation (STI). The ESD device comprises a base. The base comprises a third doped region that is doped according to a second doping polarity that is different than the first doping polarity.

In an embodiment, the apparatus comprises an integrated circuit. The ESD device is operably coupled to the integrated circuit, such that the ESD device protects the integrated circuit from relatively high current during an ESD event that would otherwise damage the integrated circuit. In particular, the ESD device is configured to become active during the ESD event. While active, current flows from one of the terminals, substantially under the dielectric isolation region, to another terminal in order to divert the current away from the integrated circuit. It may be appreciated that some embodiments of the ESD device are illustrated in FIGS. 2A and 2B.

FIG. 1 illustrates a simplified block diagram of an IC chip 100. The IC chip contains internal circuitry 110. The internal circuitry may include memory circuits, logic circuits, analog circuits, high frequency circuits, power circuits, and other suitable electronic circuits. These circuits may be implemented using a plurality of passive components such as resistors, capacitors, and inductors, and active components such as P-channel field effect transistors (pFETs), N-channel FETs (nFETs), metal-oxide semiconductor field effect transistors (MOSFETs), or complementary metal-oxide semiconductor (CMOS) transistors.

The IC chip also contains one or more ESD protection devices 120. In some embodiments illustrated herein, each ESD protection device 120 is a breakdown mode device and may include a BJT device. In alternative embodiments, the ESD protection device 120 may also include other types of suitable devices. The input of one or more of the ESD protection devices 120 is electrically coupled to the internal circuitry 110, so that these ESD protection device 120 can shunt current with the internal circuitry 110. Both the internal circuitry 110 and one or more of the ESD protection devices 120 may be electrically coupled to a power line (e.g., VDD) as well as a ground line (e.g., VSS). Some of the ESD protection devices 120 may also be electrically coupled in parallel with one or more input/output (I/O) devices 130. Some of these I/O devices 130 and some of the ESD protection devices 120 may also be electrically coupled to an I/O pad 140, as is shown in FIG. 1.

During normal operation of the IC chip (i.e., an ESD-free environment), the ESD protection devices 120 are turned off, and thus its existence may be effectively ignored by the internal circuitry. When an ESD event occurs, however, the ESD protection devices 120 turn on and diverts incoming electrical current away from the internal circuitry 110.

FIGS. 2 to 11 are diagrammatic fragmentary cross-sectional side views of different embodiments of the ESD protection device 120 according to various aspects of the present disclosure. For reasons of clarity and consistency, similar components of these embodiments will be labeled the same throughout FIGS. 2-7. It is also understood that the cross-sectional Figures herein illustrate only a portion of the ESD protection device for the sake of simplicity, and that the ESD protection device may contain additional features that are not shown herein.

Figure 2:
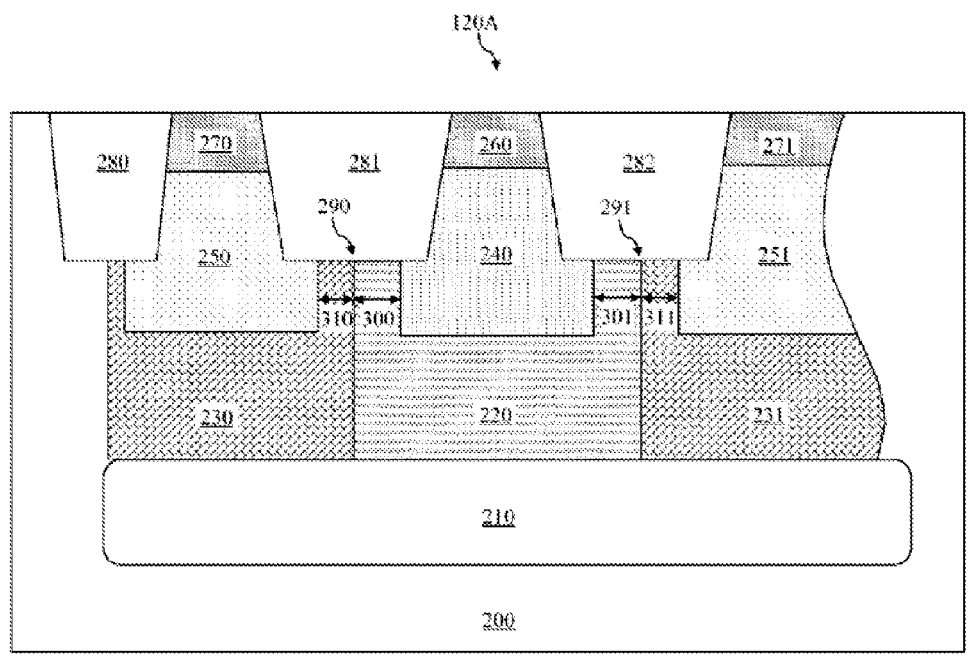
FIG. 2 is a simplified cross sectional view of a semiconductor device according to various aspects of the present disclosure.
Figure 2A:
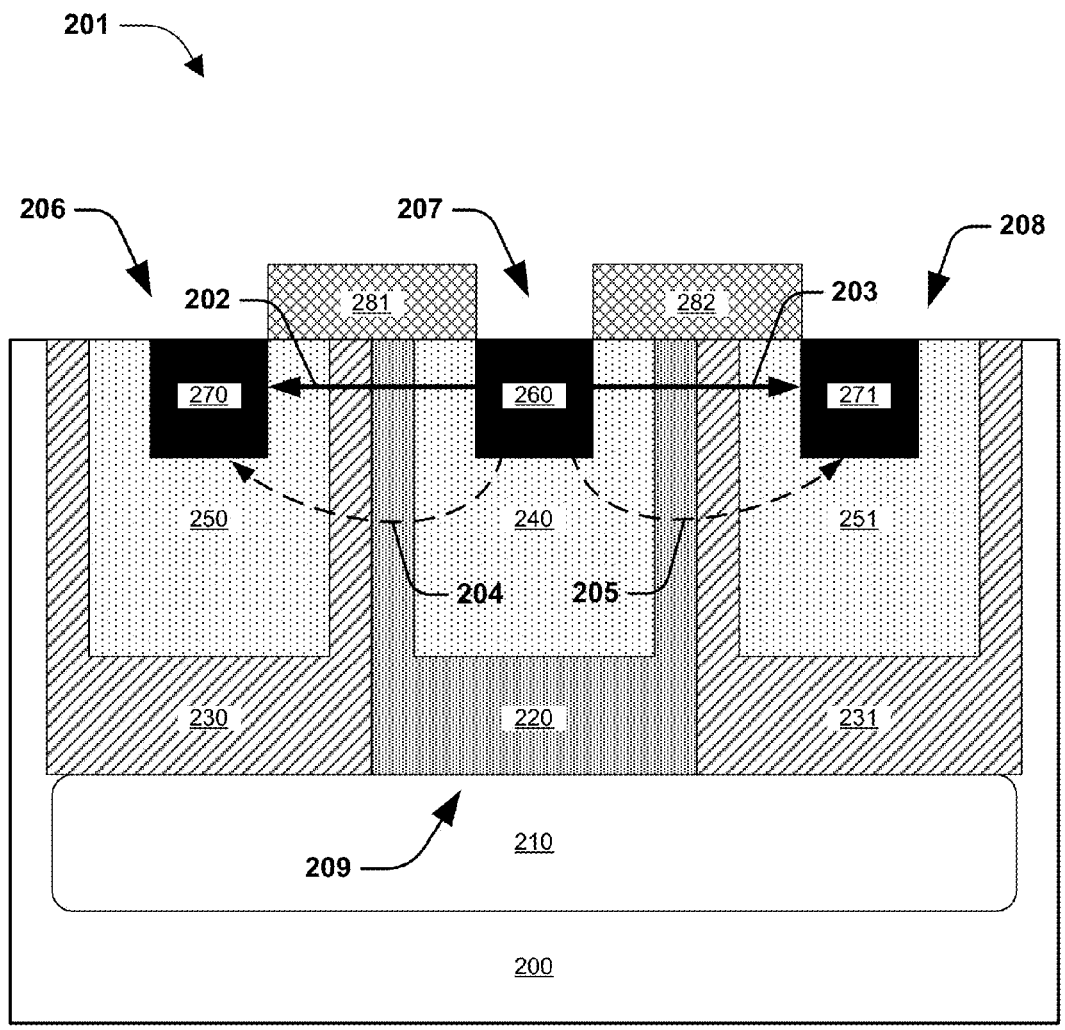
Figure 2B:
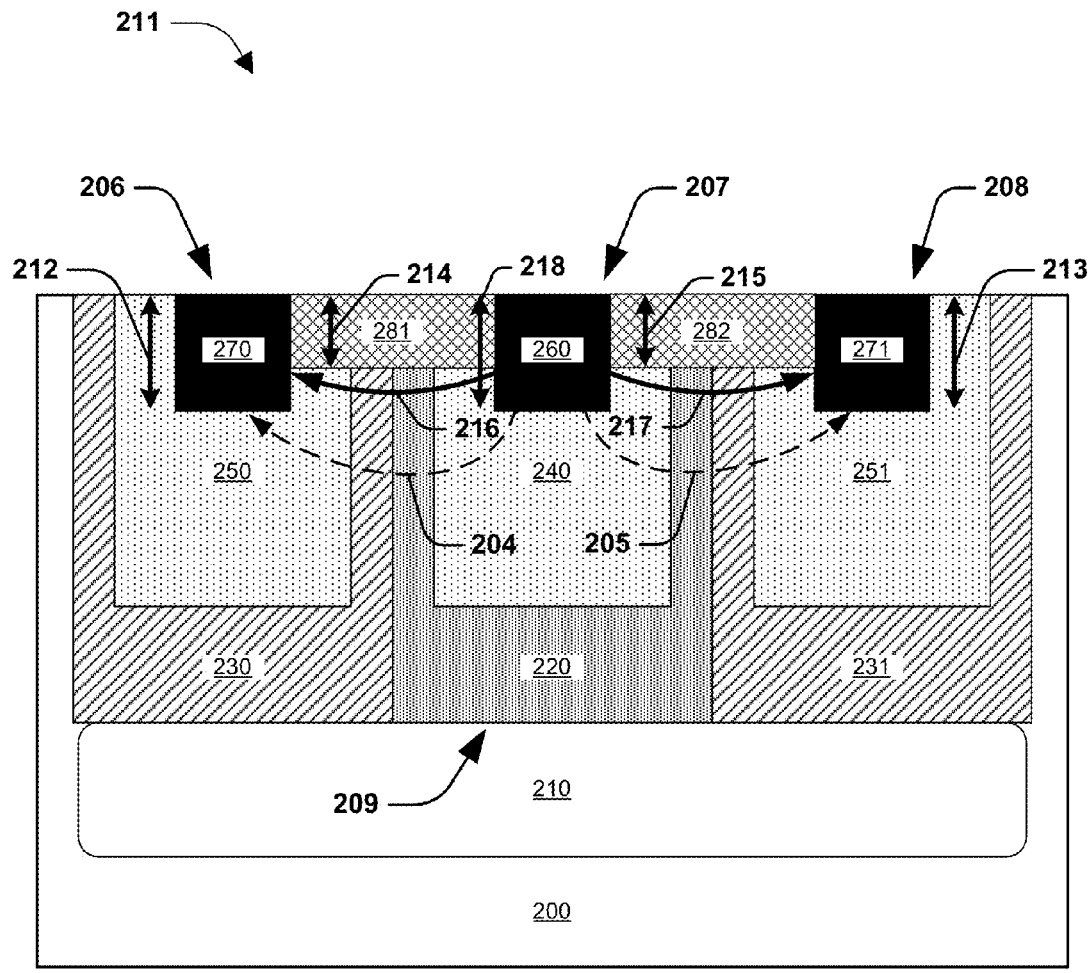

Referring to FIG. 2, an ESD protection device 120A includes a substrate 200. The substrate 200 may have various doping configurations depending on design requirements known in the art. In the illustrated embodiments, the substrate 200 includes a crystal silicon material. Alternatively, the substrate 200 may also include other elementary semiconductors such as germanium and diamond. Furthermore, in some embodiments, the substrate 200 may include a compound semiconductor and/or an alloy semiconductor.

The ESD protection device 120A includes a buried layer 210 formed in the substrate 200. The buried layer 210 may also be referred to as a deep well. The buried layer 210 may be formed by one or more ion implantation processes known in the art, in which a plurality of dopant ions are implanted to the substrate 200. In the embodiment illustrated, the buried layer 210 is doped with an n-type dopant, such as Arsenic, Phosphorous or Antimony. Thus, the buried layer 210 may also be referred to as an n-type type buried layer (NBL) or a deep n-well (DNW). In some embodiments, the buried layer 210 has a doping concentration that is in a range from about $1.0 \times 10^{17}$ ions/cm$^3$ to about $1.0 \times 10^{21}$ ions/cm$^3$. It is understood, however, that the values recited herein are merely examples and may be changed in different embodiments.

The ESD protection device 120A includes a high voltage well 220 that is formed over the buried layer 210. The high voltage well 220 may be formed by one or more ion implantation processes known in the art, in which a plurality of dopant ions are implanted to a region of the substrate 200 above the buried layer 210. The high voltage well 220 is doped with the same type dopant as the buried layer 210 and has the same doping polarity as the buried layer 210. Thus, in the illustrated embodiment, the high voltage well 220 is an n-type high voltage well, which may also be referred to as a high voltage n-well (HVNW). In some embodiments, the high voltage well 220 has a doping concentration level that is in a range from about $1.0 \times 10^{15}$ ions/cm$^3$ to about $1.0 \times 10^{18}$ ions/cm$^3$. It is understood, however, that the values recited herein are merely examples and may be changed in different embodiments.

The ESD protection device 120A includes high voltage wells 230 and 231 that are formed over the buried layer 210. The high voltage wells 230-231 are formed on opposite sides of the high voltage well 220. The high voltage wells 230-231 may be formed by one or more ion implantation processes known in the art, in which a plurality of dopant ions are implanted to a region of the substrate 200 above the buried layer 210. The high voltage wells 230-231 are doped with a different type dopant as the buried layer 210 (or the high voltage well 220) and has a doping polarity opposite than that of as the buried layer 210 (or the high voltage well 220). Thus, in the illustrated embodiment, the high voltage wells 230-231 are p-type high voltage wells, which may also be referred to as a high voltage p-well (HVPW). In some embodiments, the high voltage wells 230-231 have doping concentration levels that are in a range from about $1.0 \times 10^{15}$ ions/cm$^3$ to about $1.0 \times 10^{18}$ ions/cm$^3$.

The ESD protection device 120A includes a doped region 240 that is formed over the HVNW 220. The doped region 240 may be formed by one or more ion implantation processes known in the art. The doped region 240 is doped with the same type dopant as the HVNW 220. Thus, in the illustrated embodiment, the doped region 240 is an n-type region. The doped region 240 has a doping concentration level that is significantly greater than that of the HVNW 220, for example, about 5-100 times greater. In some embodiments, the doped region 240 has a doping concentration level that is in a range from about $5.0 \times 10^{15}$ ions/cm$^3$ to about $1.0 \times 10^{20}$ ions/cm$^3$. It is understood, however, that the values recited herein are merely examples and may be changed in different embodiments.

The ESD protection device 120A includes doped regions 250-251 that are formed over the HVPWs 230-231, respectively. The doped regions 250-251 may be formed by one or more ion implantation processes known in the art. The doped regions 250-251 are doped with the same type dopant as the HVPWs 230-231 (or opposite from the HVNW 220). Thus, in the illustrated embodiment, the doped regions 250-251 are p-type regions. The doped regions 250-251 have a doping concentration level that is significantly greater than that of the HVPWs 230-231 (or that of the HVNW 220), for example, about 5-100 times greater. In some embodiments, the doped regions 250-251 have a doping concentration level that is in a range from about $5.0 \times 10^{15}$ ions/cm$^3$ to about $1.0 \times 10^{20}$ ions/cm$^3$. It is understood, however, that the values recited herein are merely examples and may be changed in different embodiments.

Although FIG. 2 shows only one HVNW 220 and two HVPWs 230-231, it is understood that the ESD protection device 120A may include additional HVNWs or HVPWs that are not illustrated herein. For example, the ESD protection device 120A may include an additional HVNW that is adjacent to the HVPW 230 or adjacent to the HVPW 231. In other words, the HVNWs and HVPWs may be configured in an alternating or interdigitated manner. The same may be said for the doped regions 240 and 250-251.

The ESD protection device 120A also includes heavily doped regions 260 and 270-271 that are formed over the doped regions 240 and 250-251, respectively. The heavily doped regions 260 and 270-271 may be formed by one or more ion implantation processes known in the art. The heavily doped regions 260 and 270-271 are doped with the same type dopant as the HVPWs 230-231 (or opposite from the HVNW 220). Thus, in the illustrated embodiment, the heavily doped regions 260 and 270-271 are p-type regions. The heavily doped regions 260 and 270-271 have a doping concentration level that is greater than that of the doped regions 240 and 250-251. In some embodiments, the heavily doped regions 260 and 270-271 have a doping concentration level that is in a range from about $1 \times 10^{20}$ ions/cm$^3$ to about $1 \times 10^{23}$ ions/cm$^3$. It is understood, however, that the values recited herein are merely examples and may be changed in different embodiments. The heavily doped region 260 forms a p-n junction with the doped region 240 therebelow.

It is also understood that the various wells and regions may have their doping polarities switched in other embodiments. In other words, a p-type region may be formed as an n-type region, and conversely an n-type region may be formed as a p-type region. As an example, a HVPW will become a HVNW, and a HVNW will become a HVPW in those other embodiments.

The heavily doped region 260 may be considered an emitter component of a BJT device. The doped well 230 and the doped regions 250 and 270 may be collectively considered a collector component of the BJT device. Similarly, the doped well 231 and the doped regions 251 and 271 may be collectively viewed as another collector component of a different BJT device. The collector components may "share" the emitter component in some embodiments.

The doped well 220 and the doped region 240 are portions of a base component of the BJT device. The base component further includes a heavily doped region having an opposite doping polarity from the regions 260 and 270-271. Thus, in the embodiment shown in FIG. 2, the base component includes an n-type heavily doped region (not illustrated in FIG. 2). The BJT device illustrated in FIG. 2 is a p-n-p type BJT device, since its collector and emitter components are p-type devices, and the base component is an n-type device. In alternative embodiments, n-p-n type BJT devices may be formed by switching the doping polarities of the various elements discussed above. It is understood that the various elements of the BJT device may be formed using CMOS-compatible fabrication processes.

The ESD protection device 120A further includes isolation structures 280-282 that separate the doped regions 240 and 250-251 as well as the heavily doped regions 260 and 270-271 from one another. In some embodiments, the isolation structures 280-282 each include a shallow trench isolation (STI) device, which may be formed by etching a recess in the substrate 200 and thereafter filling the recess with a dielectric material. The dielectric material may contain silicon oxide, silicon nitride, silicon oxynitride, fluoride-doped silicate (FSG), and/or a low-k dielectric material known in the art. In other embodiments, the isolation structures 280-282 may include different types of isolation devices, such as deep trench isolation (DTI) devices or other suitable devices. It is understood that the isolation structures 280-282 may include any type of isolation structure formed any method currently known in the art or developed later. It may be appreciated that some embodiments of isolation structures 280-282 are illustrated in FIGS. 2A and 2B.

It is understood that the order in which the various elements of the ESD protection device 120A is described above does not imply an order in which they are fabricated. For example, the doped region 250 need not be formed after the doped region 240 is formed. Or as another example, the isolation structures 280-282 may be formed before the doped regions 240 and 250-251 are formed. In any case, the specific order in which these elements are formed may be adjusted or changed to suit design requirements and manufacturing concerns.

An interface 290 is formed at the p/n junction between the doped region 220 and the doped region 230, and an interface 291 is formed at the p/n junction between the doped region 220 and the doped region 231. Each of the interfaces 290-291 may also be considered the p/n junction interfaces between the base component and the collector components of the associated BJT device. The doped region 240 is spaced apart from the interfaces 290 and 291 by distances 300 and 301, respectively. In the embodiments discussed herein, the distances 300 and 301 may be substantially the same. In other embodiments, the distances 300-301 may be different from each other. The doped region 250 is spaced apart from the interfaces 290 by a distance 310, and the doped region 251 is spaced apart from the interface 291 by a distance 311. In the embodiments discussed herein, the distances 310 and 311 may be substantially the same. In other embodiments, the distances 310-311 may be different from each other. Furthermore, in some embodiments, the distances 300-301 and 310-311 may all be substantially equal to one another.

The length of the distances 300-301 and 310-311 may be adjusted by relevant lithography parameters, for example, the sizes of implantation masks used to form the doped regions 220, 230-231, 240, and 250-251. In some embodiments, the distances 300-301 and 310-311 are in a range from about zero to about seven microns.

The distances 300-301 and 310-311 may each be adjusted independently to achieve a desired value for a turn-on voltage (also referred to as a threshold voltage) for the associated BJT device, a desired value for a breakdown voltage of the BJT device, as well as a desired value for a holding voltage for the BJT device. These voltages will be discussed in more detail with reference to FIG. 18 later. In some embodiments, the distances 300-301 (or the distances 310-311) may be tuned such that the associated BJT device will be self-triggered by the current that is generated by lateral avalanche breakdown. In that case, the values for the turn-on voltage, the breakdown voltage, and the holding voltage are substantially equal to one another. In other words, the turn-on voltage is approximately equal to the breakdown voltage, which is approximately equal to the holding voltage. In some embodiments, the turn-on voltage, the breakdown voltage, and the holding voltage are within a few milli-volts or a few tens of milli-volts of one another. Thus, the embodiments disclosed herein allows for altering device characteristics through the tuning of layout parameters.

FIG. 2A is a diagrammatic fragmentary cross-sectional side view of an embodiment of an ESD device 201. The ESD device 201 is similar to the ESD protection device 102A in many aspects. For example, the ESD device 201 comprises a substrate 200 and a buried layer 210 positioned above the substrate 200. The ESD device 201 comprises doped wells 220, 230, and 231. The ESD device 201 comprises doped regions 240, 250, and 251. The ESD device 201 comprises heavily doped regions 260, 270, and 271. In an embodiment, the ESD device 201 comprises an emitter 207. The emitter 207 comprises the heavily doped region 260. The ESD device 201 comprises a first collector 206 and a second collector 208. The first collector 206 comprises at least one of the heavily doped region 270, the doped region 250, or the doped well 230. The second collector 208 comprises at least one of the heavily doped region 271, the doped region 251, or the doped well 231. In an embodiment, the ESD device 201 comprises a base, where at least some of the base 209 comprises at least some of at least one of the doped region 240 or the doped well 220.

The ESD device 201 comprises a first isolation structure 281 and a second isolation structure 282. The first isolation structure 281 provides isolation between the emitter 207 and the first collector 206. The second isolation structure 282 provides isolation between the emitter 207 and the second collector 208. In an embodiment, the isolation structures 281 and 282 comprise resist protective oxide (RPO) layers. In an embodiment, the isolation structures 281 and 282 do not comprise shallow trench isolation (STI). In an embodiment, the isolation structures 281 and 282 are formed at a depth that is less than at least one of a depth of the emitter 207, a depth of the first collector 206, or a depth of the second collector 208. For example, the isolation structures 281 and 282 are formed on top of a surface of the substrate 200.

During an ESD event, current flows from the emitter 207 to the first collector 206 along a first path 202, and current flows from the emitter 207 to the second collector 208 along a second path 203. The first path 202 and the second path 203 are relatively short compared with a first longer path 204 and a second longer path 205 along which current would otherwise travel if the isolation structures 281 and 282 were formed deeper into the substrate 200, such as below the heavily doped regions 260, 270, and 271. The relatively short distance of the first path 202 and the second path 203 allows the ESD device 201 to handle relatively higher normalized current, normalized to a size of the ESD device 201, than if the current had to pass through the longer distance of the first longer path 204 and the second longer path 205 because the first path 202 and the second path 203 provide relatively smaller resistance than the first longer path 204 and the second longer path 205. For example, the ESD device 201 can handle higher current flow during an ESD event before failure than an ESD device that utilizes deeper isolation structures, such as STI, for example, that force the current to flow along a longer path, such as the first longer path 204 and second longer path 205.

FIG. 2B is a diagrammatic fragmentary cross-sectional side view of an embodiment of an ESD device 211. The ESD device 211 is similar to the ESD protection device 102A in many aspects. For example, the ESD device 211 comprises a substrate 200 and a buried layer 210 positioned above the substrate 200. The ESD device 211 comprises doped wells 220, 230, and 231. The ESD device 211 comprises doped regions 240, 250, and 251. The ESD device 211 comprises heavily doped regions 260, 270, and 271. In an embodiment, the ESD device 211 comprises an emitter 207. The emitter 207 comprises the heavily doped region 260. The ESD device 211 comprises a first collector 206 and a second collector 208. The first collector 206 comprises at least one of the heavily doped region 270, the doped region 250, or the doped well 230. The second collector 208 comprises at least one of the heavily doped region 271, the doped region 251, or the doped well 231. In an embodiment, the ESD device 211 comprises a base, where at least some of the base 209 comprises at least some of at least one of the doped region 240 or the doped well 220.

The ESD device 211 comprises a first isolation structure 281 and a second isolation structure 282. The first isolation structure 281 provides isolation between the emitter 207 and the first collector 206. The second isolation structure 282 provides isolation between the emitter 207 and the second collector 208. In one embodiment, the isolation structures 281 and 282 comprise resist protective oxide (RPO) layers. In an embodiment, the isolation structures 281 and 282 do not comprise shallow trench isolation (STI). In an embodiment, the isolation structures 281 and 282 are formed at a depth that is less than at least one of a depth of the emitter 207, a depth of the first collector 206, or a depth of the second collector 208. For example, the first isolation structure 281 is formed at a first depth 214 and the second isolation structure 282 is formed at a second depth 215. The first depth 214 of the first isolation structure 281 is less than at least one of a third depth 212 of the heavily doped region 270 of the first collector 206, a fourth depth 213 of the heavily doped region 271 of the second collector 208, or a fifth depth 218 of the heavily doped region 260 of the emitter 207. The second depth 215 of the second isolation structure 282 is less than at least one of the third depth 212 of the heavily doped region 270 of the first collector 206, the fourth depth 213 the heavily doped region 271 of the second collector 208, or the fifth depth 218 of the heavily doped region 260 of the emitter 207. In an embodiment, the first depth 214 of the first isolation structure 281 is formed at a depth that is less than a depth of a shallow trench isolation structure, such as isolation structures 280-282 for the ESD device 120A of FIG. 2. In an embodiment, the second depth 215 of the second isolation structure 282 is formed at a depth that is less than a depth of a shallow trench isolation structure, such as isolation structures 280-282 for the ESD device 120A of FIG. 2.

During an ESD event, current flows from the emitter 207, under the first isolation structure 281, to the first collector 206 along a first path 216, and current flows from the emitter 207, under the second isolation structure 282, to the second collector 208 along a second path 217. The first path 216 and the second path 217 are relatively short compared with a first longer path 204 and a second longer path 205 along which current would otherwise travel if the isolation structures 281 and 282 were formed deeper into the substrate 200, such as below the heavily doped regions 260, 270, and 271. The relatively short distance of the first path 216 and the second path 217 allow the ESD device 211 to handle relatively higher normalized current, normalized to a size of the ESD device 211, than if the current had to pass through the longer distance of the first longer path 204 and the second longer path 205 because the first path 216 and the second path 217 provide relatively less resistance than the first longer path 204 and the second longer path 205. For example, the ESD device 201 can handle higher current flow during an ESD event before failure than an ESD device that utilizes deeper isolation structures, such as STI, for example, that force the current to flow along a longer path, such as the first longer path 204 and second longer path 205. In some embodiments, at least some of the doped regions illustrated in at least one of FIG. 2A or FIG. 2B are optional, such as is illustrated in FIGS. 3-10, for example.

Figure 3:
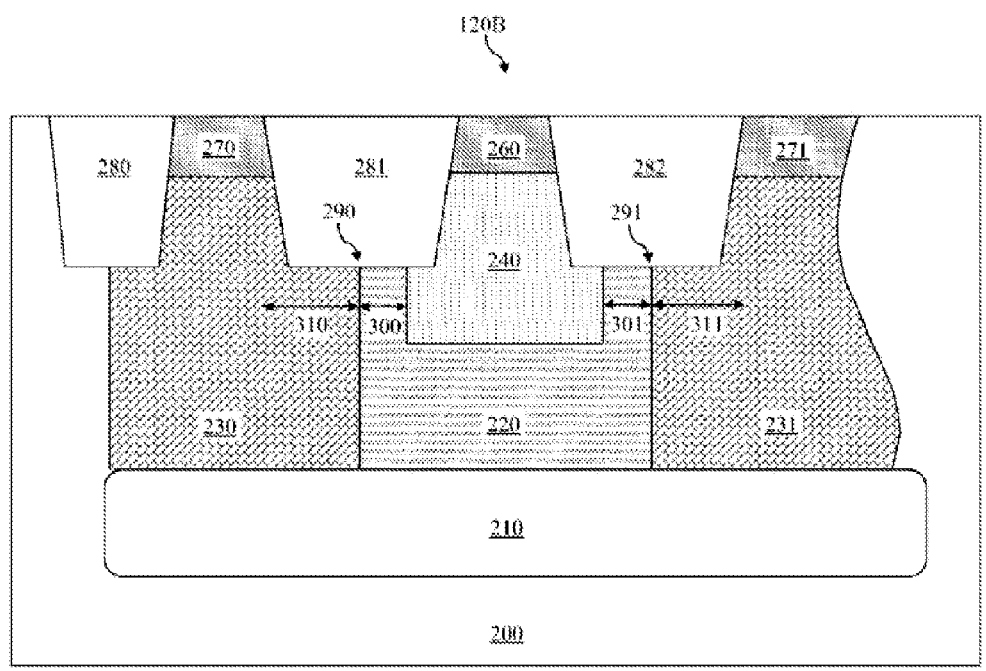
FIG. 3 is a simplified cross sectional view of a semiconductor device according to various aspects of the present disclosure.

FIG. 3 is a diagrammatic fragmentary cross-sectional side view of an alternative embodiment of an ESD protection device 120B. The ESD protection device 120B is similar to the ESD protection device 120A in many aspects. For example, the ESD protection device 120B includes a buried layer 210, doped wells 220 and 230-231, a doped region 240, heavily doped regions 260 and 270-271, and isolation structures 280-282. But unlike the ESD protection device 120A, the ESD protection device 120B does not have the doped regions 250-251. Thus, while the emitter and base components remain substantially the same for the ESD protection device 120B, each collector component now includes the well 230 and the heavily doped region 270 (or the well 231 and the heavily doped region 271) but not the doped regions 250-251.

The interfaces 290-291 between the base component and the collector components may remain substantially unchanged for the ESD protection device 290B, and therefore the distances 300-301 may remain the same. However, the distances 310-311 are now measured from the interfaces 290-291 into a region somewhere inside the doped wells 230-231, respectively. In other words, the distances 310-311 may be greater than the distances 300-301. The shorter distances 300-301 are more dominant factors (compared to the longer distances 310-311) for the values for the associated BJT device's turn-on voltage, breakdown voltage, and holding voltage. Thus, the desired values for the turn-on voltage, the breakdown voltage, and the holding voltage may be chosen mostly based on the length of the distances 300 or 301.

Figure 4:
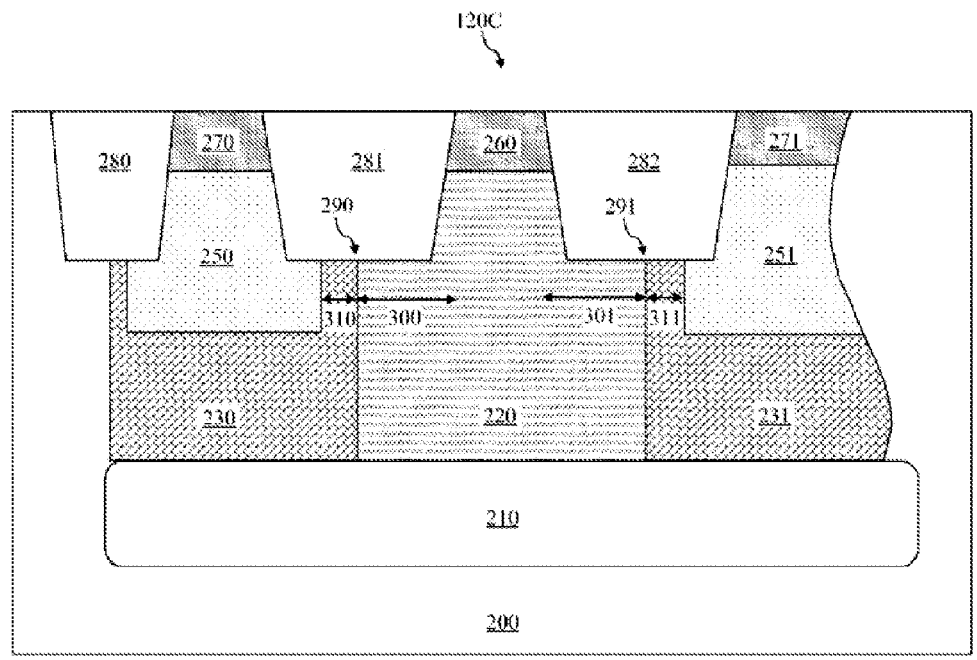
FIG. 4 is a simplified cross sectional view of a semiconductor device according to various aspects of the present disclosure.

FIG. 4 is a diagrammatic fragmentary cross-sectional side view of an alternative embodiment of an ESD protection device 120C. The ESD protection device 120C is similar to the ESD protection device 120A in many aspects. For example, the ESD protection device 120C includes a buried layer 210, doped wells 220 and 230-231, doped regions 250-251, heavily doped regions 260 and 270-271, and isolation structures 280-282. But unlike the ESD protection device 120A, the ESD protection device 120C does not have the doped region 240. Thus, while the collector and emitter components remain substantially the same for the ESD protection device 120C, the base component now includes the well 220 but not the doped region 240.

The interfaces 290-291 between the base component and the collector components may remain substantially the same for the ESD protection device 290C, and therefore the distances 310-311 may remain the same. However, the distances 300-301 are now measured from the interfaces 290-291 into a region somewhere inside the doped well 220. In other words, the distances 300-301 may be greater than the distances 310-311. The shorter distances 310-311 are more dominant factors (compared to the longer distances 300-301) for the values for the associated BJT device's turn-on voltage, breakdown voltage, and holding voltage. Thus, the desired values for the turn-on voltage, the breakdown voltage, and the holding voltage may be chosen mostly based on the length of the distances 310 or 311.

Figure 5:
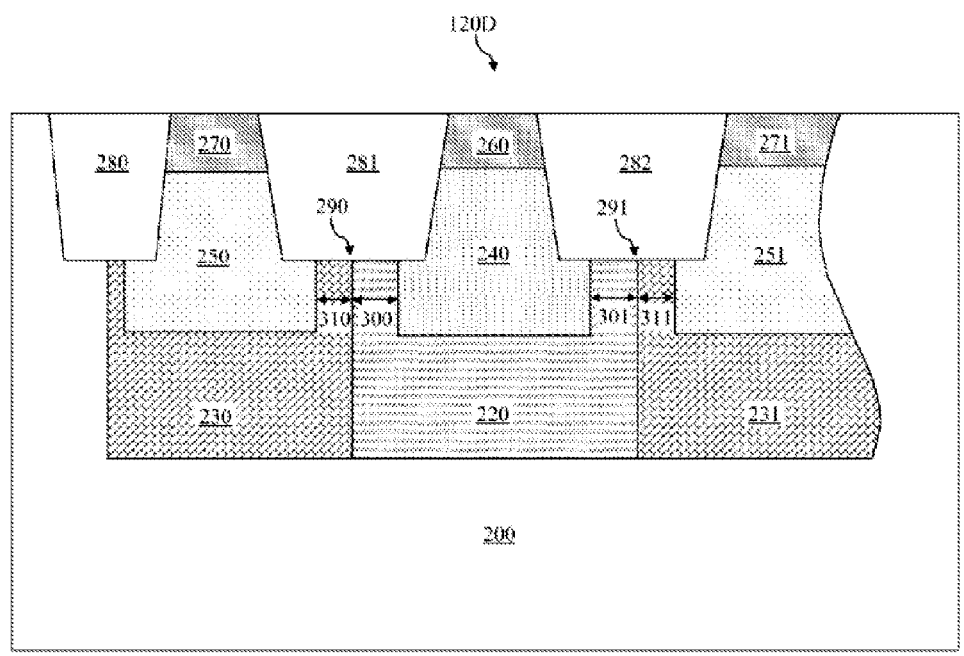
FIG. 5 is a simplified cross sectional view of a semiconductor device according to various aspects of the present disclosure.

FIG. 5 is a diagrammatic fragmentary cross-sectional side view of an alternative embodiment of an ESD protection device 120D. The ESD protection device 120D is similar to the ESD protection device 120A in many aspects. For example, the ESD protection device 120D includes doped wells 220 and 230-231, doped regions 240 and 250-251, heavily doped regions 260 and 270-271, and isolation structures 280-282. But unlike the ESD protection device 120A, the ESD protection device 120D does not have the buried layer 210. The base, emitter and collector components of the ESD protection device 120D may remain substantially the same as those of the ESD protection device 120A, respectively.

Figure 6:
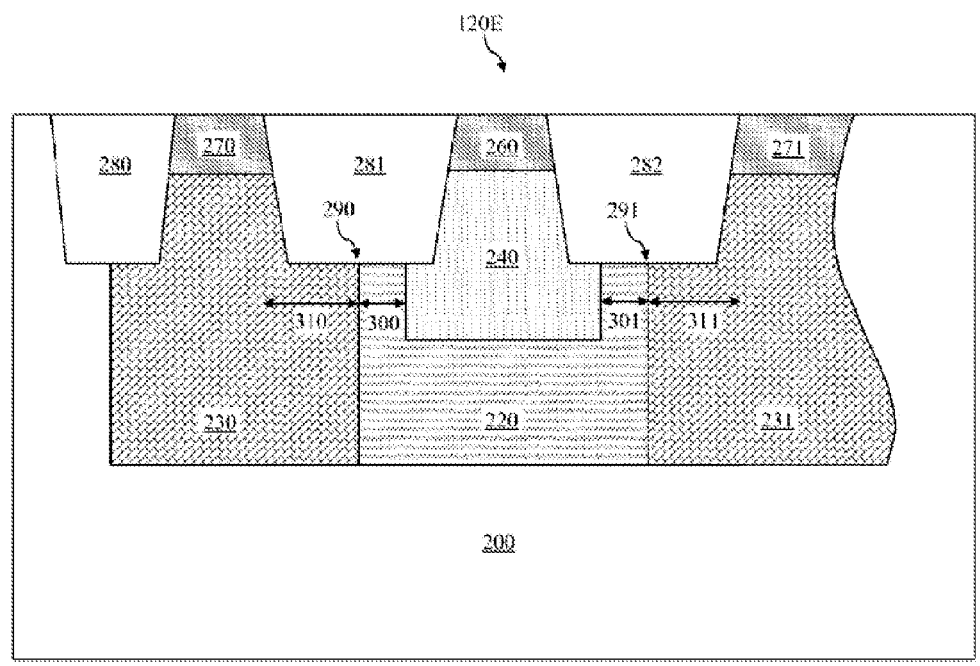
FIG. 6 is a simplified cross sectional view of a semiconductor device according to various aspects of the present disclosure.

FIG. 6 is a diagrammatic fragmentary cross-sectional side view of an alternative embodiment of an ESD protection device 120E. The ESD protection device 120E is similar to the ESD protection device 120B in many aspects. For example, the ESD protection device 120E includes doped wells 220 and 230-231, a doped region 240, heavily doped regions 260 and 270-271, and isolation structures 280-282. But unlike the ESD protection device 120B, the ESD protection device 120E does not have the buried layer 210. The base, emitter and collector components of the ESD protection device 120E may remain substantially the same as those of the ESD protection device 120B, respectively.

Figure 7:
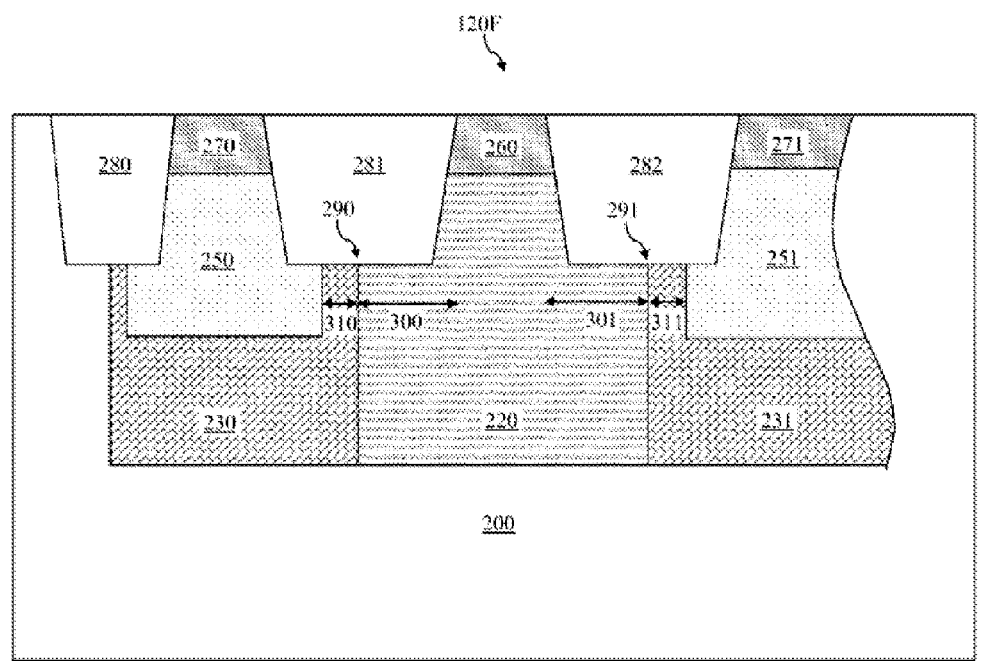
FIG. 7 is a simplified cross sectional view of a semiconductor device according to various aspects of the present disclosure.

FIG. 7 is a diagrammatic fragmentary cross-sectional side view of an alternative embodiment of an ESD protection device 120F. The ESD protection device 120F is similar to the ESD protection device 120C in many aspects. For example, the ESD protection device 120F includes doped wells 220 and 230-231, doped regions 250-251, heavily doped regions 260 and 270-271, and isolation structures 280-282. But unlike the ESD protection device 120C, the ESD protection device 120F does not have the buried layer 210. The base, emitter and collector components of the ESD protection device 120F may remain substantially the same as those of the ESD protection device 120C, respectively.

Figure 8:
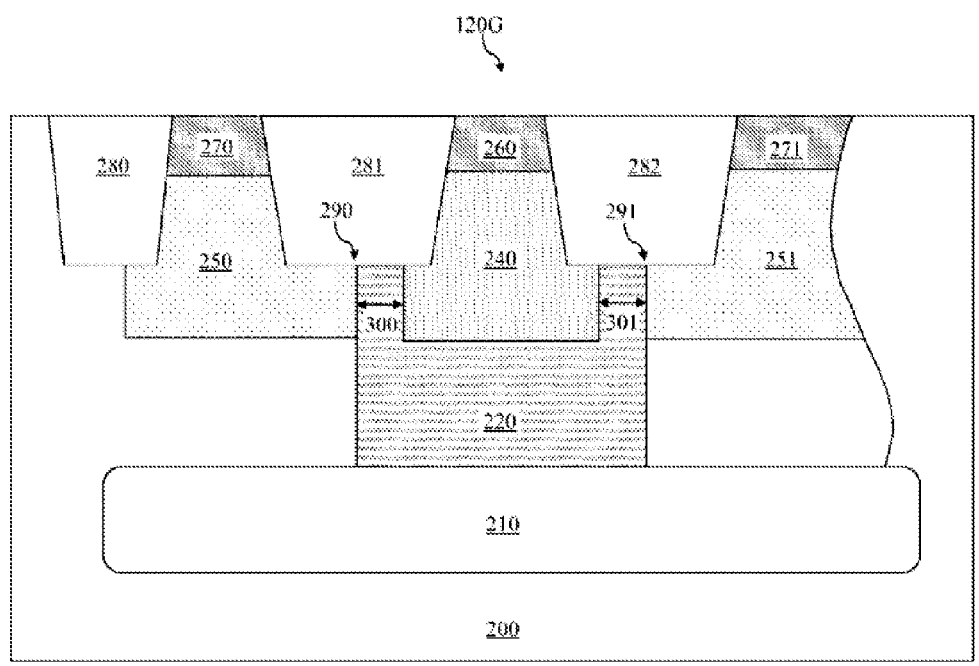
FIG. 8 is a simplified cross sectional view of a semiconductor device according to various aspects of the present disclosure.

FIG. 8 is a diagrammatic fragmentary cross-sectional side view of an alternative embodiment of an ESD protection device 120G. The ESD protection device 120G is similar to the ESD protection device 120A in many aspects. For example, the ESD protection device 120G includes a buried layer 210, a doped well 220, doped regions 240 and 250-251, heavily doped regions 260 and 270-271, and isolation structures 280-282. But unlike the ESD protection device 120A, the ESD protection device 120G does not have the doped wells 230-231. The base component of the ESD protection device 120G includes the doped well 220 and the doped region 240. The emitter component of the ESD protection device 120G includes the heavily doped region 260. The collector component of the ESD protection device 120G includes the doped regions 250 and 270 (or the doped regions 251 and 271).

Figure 9:
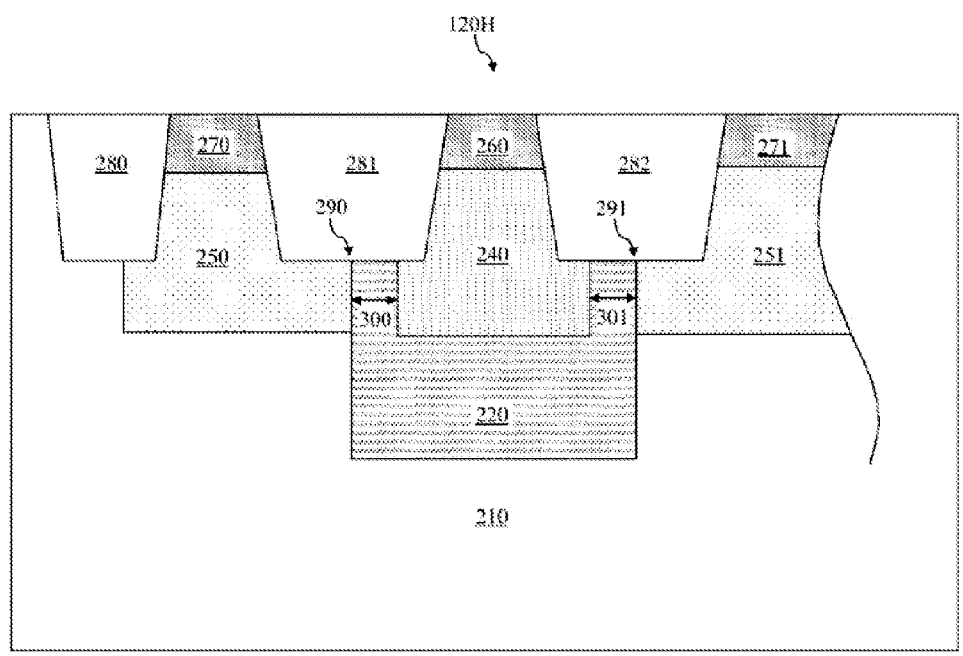
FIG. 9 is a simplified cross sectional view of a semiconductor device according to various aspects of the present disclosure.

FIG. 9 is a diagrammatic fragmentary cross-sectional side view of an alternative embodiment of an ESD protection device 120H. The ESD protection device 120H is similar to the ESD protection device 120G in many aspects. For example, the ESD protection device 120H includes a doped well 220, doped regions 240 and 250-251, heavily doped regions 260 and 270-271, and isolation structures 280-282. But unlike the ESD protection device 120G, the ESD protection device 120H does not have the buried layer 210. The base component of the ESD protection device 120G includes the doped well 220 and the doped region 240. The emitter component of the ESD protection device 120G includes the heavily doped region 260. The collector component of the ESD protection device 120G includes the doped regions 250 and 270 (or the doped regions 251 and 271).

Figure 10:
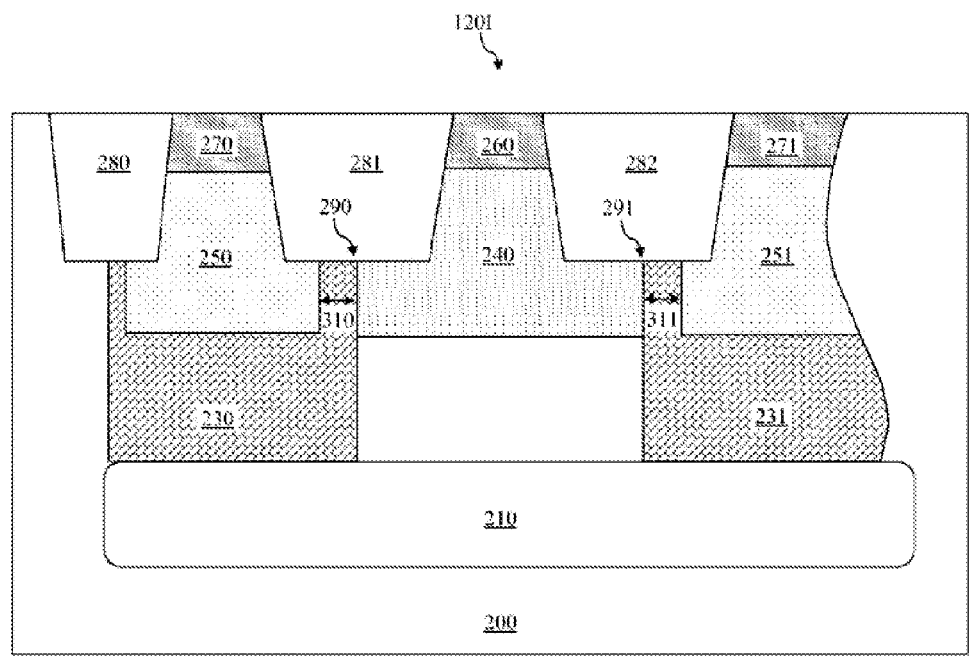
FIG. 10 is a simplified cross sectional view of a semiconductor device according to various aspects of the present disclosure.

FIG. 10 is a diagrammatic fragmentary cross-sectional side view of an alternative embodiment of an ESD protection device 120I. The ESD protection device 120I is similar to the ESD protection device 120A in many aspects. For example, the ESD protection device 120I includes a buried layer 210, doped wells 230-231, doped regions 240 and 250-251, heavily doped regions 260 and 270-271, and isolation structures 280-282. But unlike the ESD protection device 120A, the ESD protection device 120I does not have the doped well 220. The base component of the ESD protection device 120I includes the doped region 240. The emitter component of the ESD protection device 120I includes the heavily doped region 260. The collector component of the ESD protection device 120I includes the doped well 230 and the doped regions 250 and 270 (or the doped well 231 and the doped regions 251 and 271).

Figure 11:
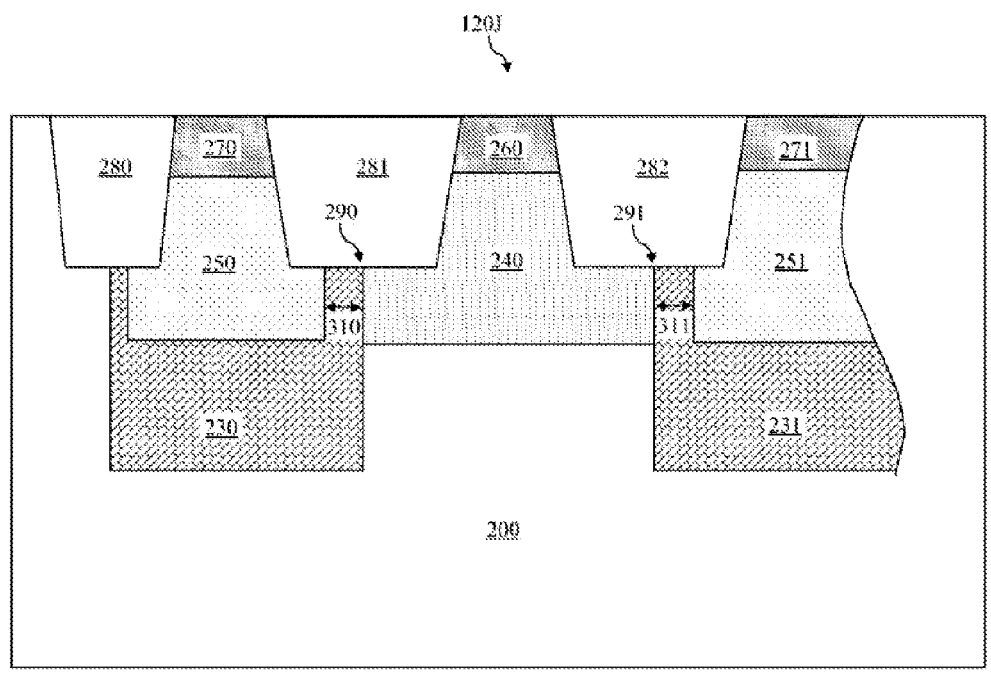
FIG. 11 is a simplified cross sectional view of a semiconductor device according to various aspects of the present disclosure.

FIG. 11 is a diagrammatic fragmentary cross-sectional side view of an alternative embodiment of an ESD protection device 120J. The ESD protection device 120J is similar to the ESD protection device 120D in many aspects. For example, the ESD protection device 120J includes doped wells 230-231, doped regions 240 and 250-251, heavily doped regions 260 and 270-271, and isolation structures 280-282. But unlike the ESD protection device 120D, the ESD protection device 120J does not have the doped well 220. The base component of the ESD protection device 120J includes the doped region 240. The emitter component of the ESD protection device 120I includes the heavily doped region 260. The collector component of the ESD protection device 120J includes the doped well 230 and the doped regions 250 and 270 (or the doped well 231 and the doped regions 251 and 271). The doped region 240 is formed over portions of the substrate 200 instead of being formed over the doped well 220.

It is understood that the various embodiments of the ESD protection device 120 illustrated in FIGS. 2-11 are provided merely as examples and are not intended to be limiting. Depending on design requirements and manufacturing concerns, the ESD protection device may have different configurations consistent with the spirit of the present disclosure in alternative embodiments.

Figure 12:
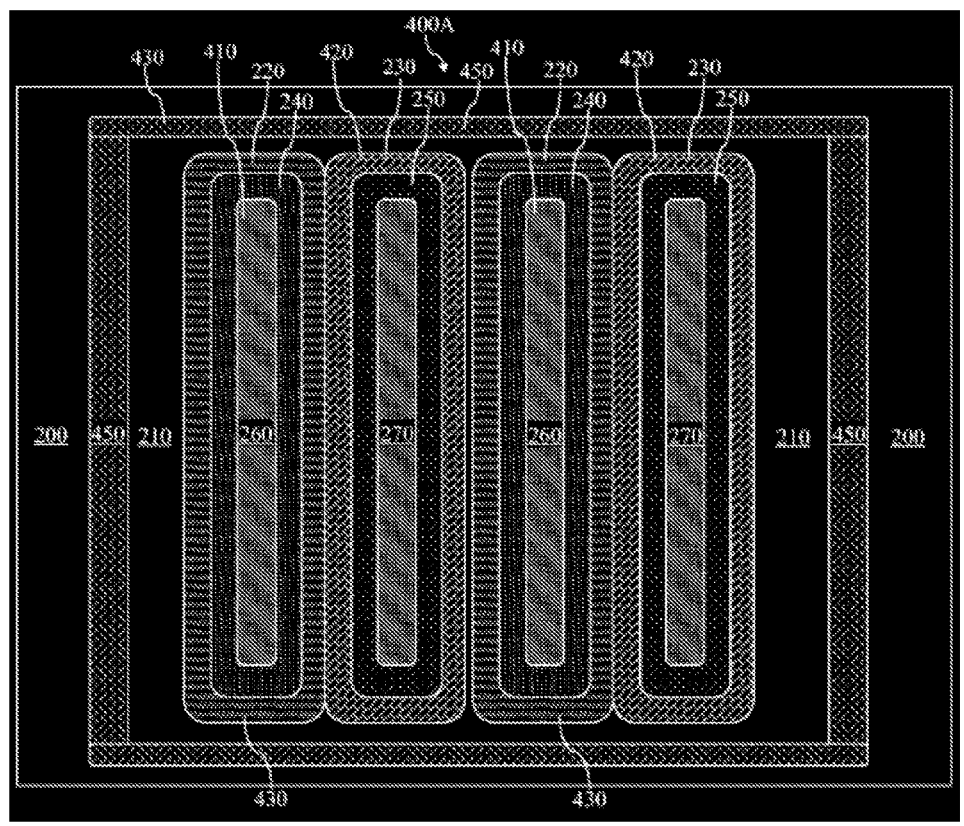
FIG. 12 is a simplified top view of a semiconductor device according to various aspects of the present disclosure.

FIG. 12 is a diagrammatic fragmentary top view of a portion of an ESD protection device 400A according to an embodiment of the present disclosure. The ESD protection device 400A is substantially similar to the ESD protection device 120 and may be implemented according to any of the embodiments of the ESD protection device 120 shown in the cross-sectional views of FIGS. 2-11. For the sake of providing an example, the ESD protection device 400A shown in FIG. 12 is implemented with the ESD protection device 120A shown in FIG. 2. For reasons of clarity and consistency, similar components of the ESD protection device 120A and 400A will be labeled the same in both FIGS. 2 and 12.

The ESD protection device 400A includes emitter components 410 and collector components 420 and a base component 430 formed over the substrate 200. As discussed above with reference to FIG. 2, the emitter components 410 and the collector components 420 are interdigitated or disposed in an alternating fashion. Each emitter component 410 includes the heavily doped region 260. The base component 430 includes the doped well 220, the doped region 240, and a heavily doped region 450. The heavily doped region 260 a higher doping concentration level than the doped well 220 and the doped region 240, and the doped region 240 has a higher doping concentration level than the doped well 220. As FIG. 12 illustrates, the heavily doped region 260 (i.e., emitter component 410) is surrounded by the doped region 240 (part of the base component 430), which is surrounded by the doped well 220 (also part of the base component 430) in a top view.

Each collector component 420 includes the doped well 230, the doped region 250, and the heavily doped region 270. Among these elements of the collector component 420, the heavily doped region 270 has the highest doping concentration level, the doped well 230 has the lowest doping concentration level, and the doped region 250 has a doping concentration level in the middle (greater than the doped well 230 but less than the heavily doped region 270). As FIG. 12 illustrates, the heavily doped region 270 is surrounded by the doped region 250, which is surrounded by the doped well 230 in a top view.

The doped wells 220 and 230 have opposite doping polarities, and the doped regions 240 and 260 have opposite doping polarities. The doped well 220 and the doped region 240 have the same doping polarity, as do the doped well 230 and the doped region 250. The heavily doped regions 260 and 270 have the same doping polarity as the doped well 230 and the doped region 250, but the opposite doping polarity from the doped well 220 and the doped region 240. In the illustrated embodiment, the doped well 220 and the doped region 240 are of an n-type doping polarity, whereas the doped well 230, the doped region 250, and the heavily doped regions 260 and 270 are all of the p-type doping polarity.

The emitter components 410, the collector components 420, and portions of the base component 430 are formed over (and thus surrounded in a top view by) the buried layer 210. The buried layer 210 has the same doping polarity as the doped well 220 and the doped region 240. Thus, the buried layer 210 is of an n-type doping polarity in the embodiment shown in FIG. 12.

The heavily doped region 450 of the base component 430 has the same doping polarity but a higher doping concentration level than the doped well 220 and the doped region 240. In the top view of FIG. 12, the heavily doped region 450 is shaped as an approximately rectangular ring that surrounds the emitter components 410 and the collector components 420. Electrical connections between the base component 430 and external devices may be established through the ring-like heavily doped region 450. Thus, the embodiment shown in FIG. 12 may be referred to as an ESD protection device having a "ring type" base pickup.

Figure 13:
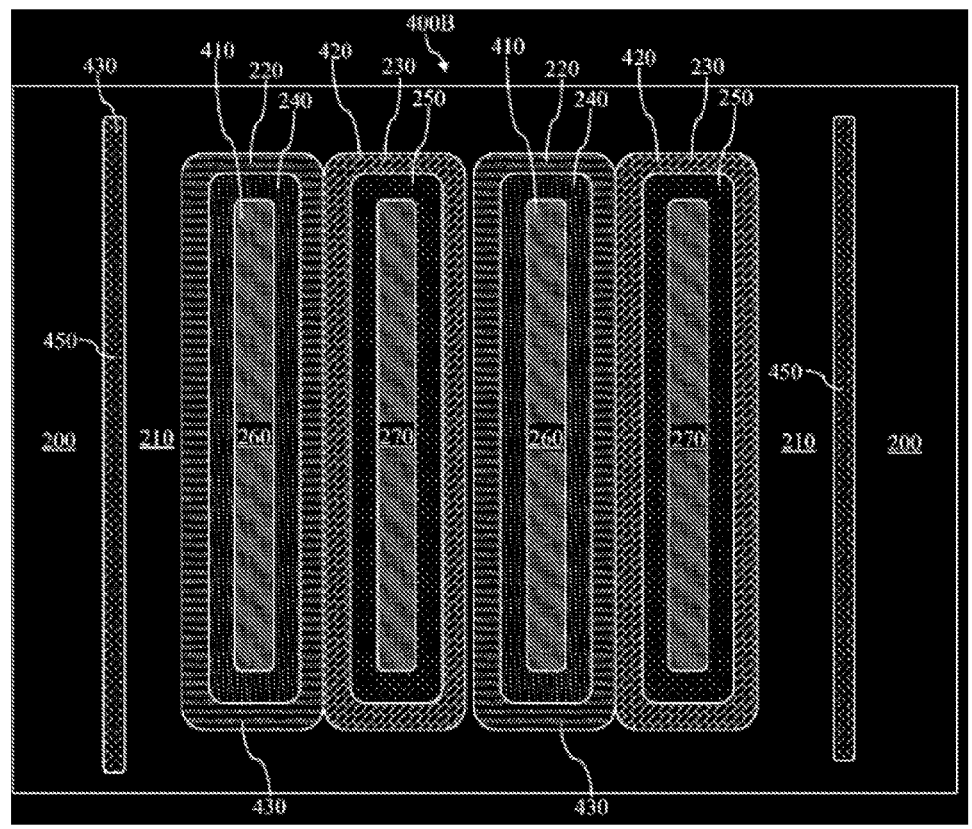
FIG. 13 is a simplified top view of a semiconductor device according to various aspects of the present disclosure.

FIG. 13 is a diagrammatic fragmentary top view of a portion of an ESD protection device 400B according to another embodiment of the present disclosure. The ESD protection device 400B is similar to the ESD protection device 400A, except that the heavily doped regions 450 of the base component are shaped as "bands" located besides the emitter and collector components 410 and 420, rather than a "ring" around them. Electrical connections between the base component 430 and external devices may be established through the band-like heavily doped region 450. Thus, the embodiment shown in FIG. 13 may be referred to as an ESD protection device having a "band type" base pickup.

Figure 14:
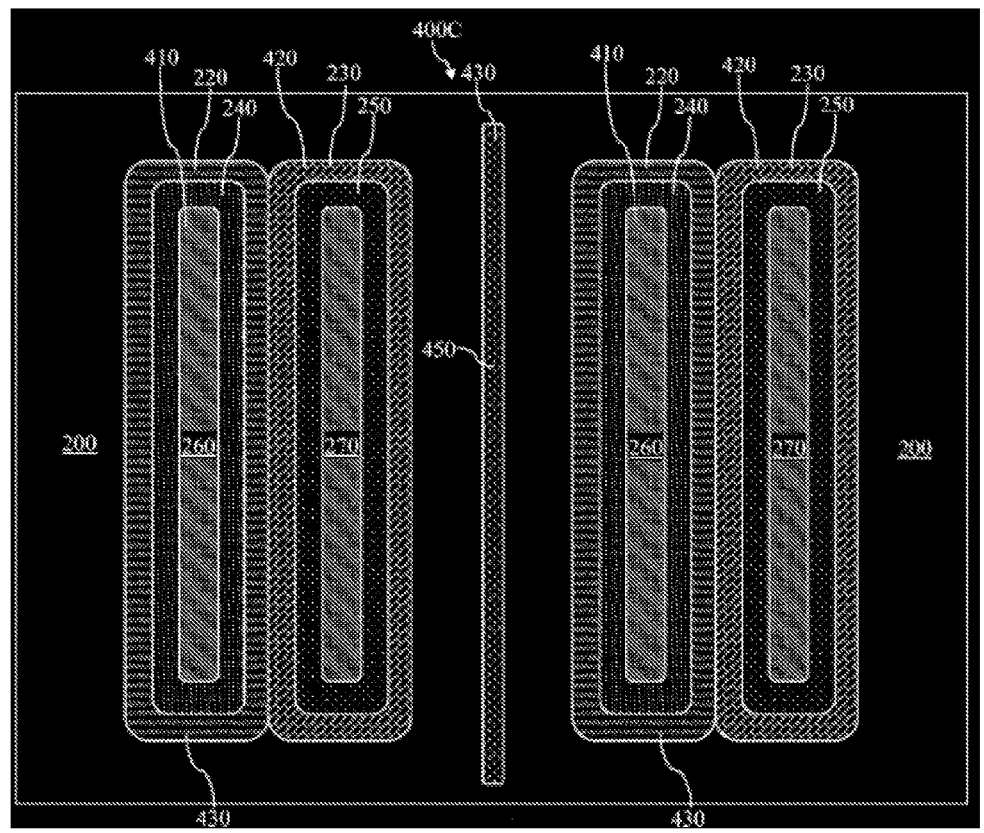
FIG. 14 is a simplified top view of a semiconductor device according to various aspects of the present disclosure.

FIG. 14 is a diagrammatic fragmentary top view of a portion of an ESD protection device 400C according to another embodiment of the present disclosure. The ESD protection device 400C is similar to the ESD protection device 400B, except that the heavily doped region 450 of the base component forms a single "band" between the emitter and collector components 410 and 420. Electrical connections between the base component 430 and external devices may be established through the band-like heavily doped region 450. Thus, the embodiment shown in FIG. 14 may be referred to as an ESD protection device having an alternative "band type" base pickup.

Figure 15:
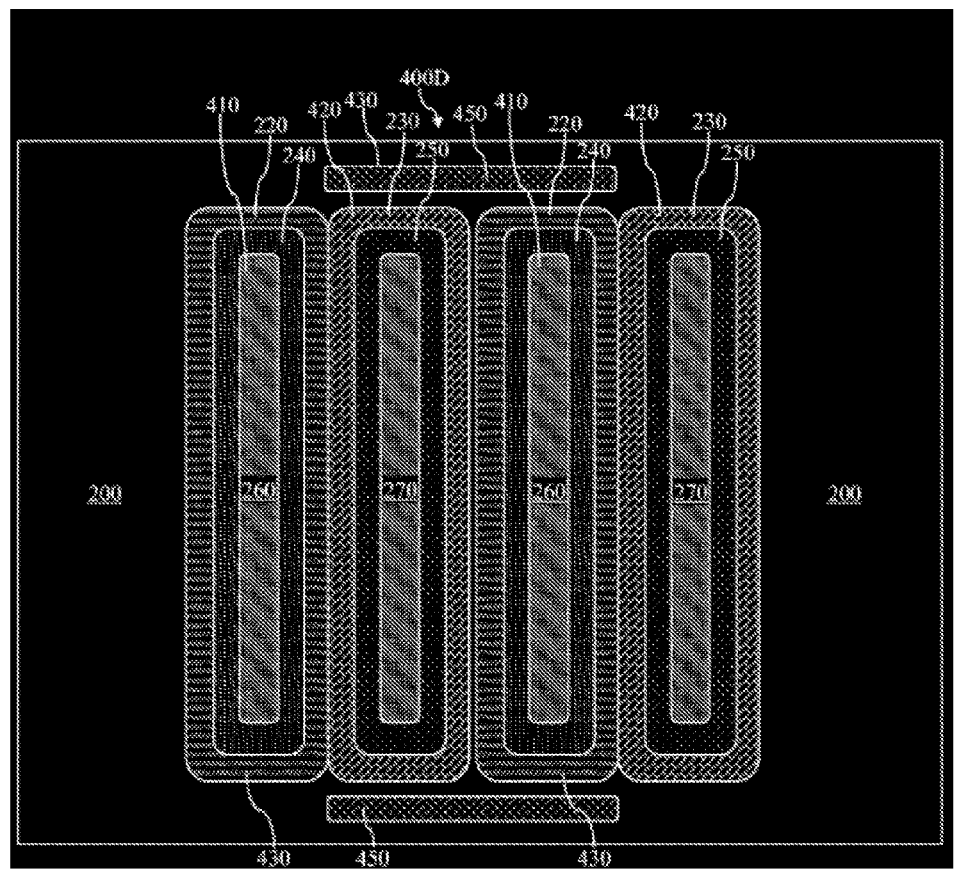
FIG. 15 is a simplified top view of a semiconductor device according to various aspects of the present disclosure.

FIG. 15 is a diagrammatic fragmentary top view of a portion of an ESD protection device 400D according to yet another embodiment of the present disclosure. The ESD protection device 400C is similar to the ESD protection device 400B, except that the heavily doped regions 450 of the base component forms two "bands" on different sides of the emitter and collector components 410 and 420. The bands (i.e., the doped regions 450) in FIG. 15 are rotated 90 degrees compared to the bands in FIG. 13. Electrical connections between the base component 430 and external devices may be established through the ring-like heavily doped region 450. Thus, the embodiment shown in FIG. 15 may be referred to as an ESD protection device having yet another alternative "band type" base pickup.

Figure 16:
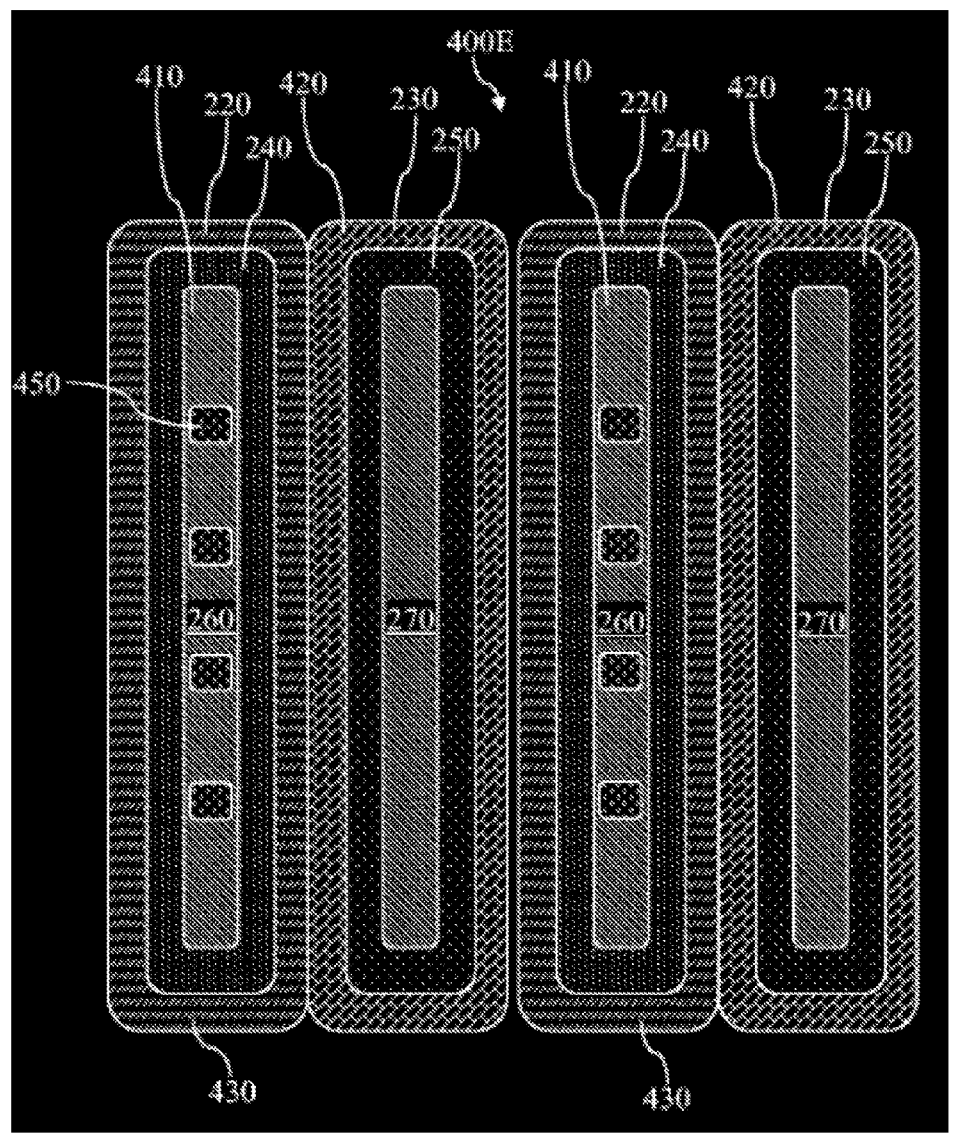
FIG. 16 is a simplified top view of a semiconductor device according to various aspects of the present disclosure.

FIG. 16 is a diagrammatic fragmentary top view of a portion of an ESD protection device 400E according to another embodiment of the present disclosure. The ESD protection device 400E is similar to the ESD protection device 400A, except that the heavily doped regions 450 of the base component are shaped as "dots" (or small squares or rectangles) located within the heavily doped region 260 (i.e., the emitter component 410). Electrical connections between the base component 430 and external devices may be established through the dot-like heavily doped regions 450. Thus, the embodiment shown in FIG. 16 may be referred to as an ESD protection device having a "dot type" base pickup.

Figure 17:
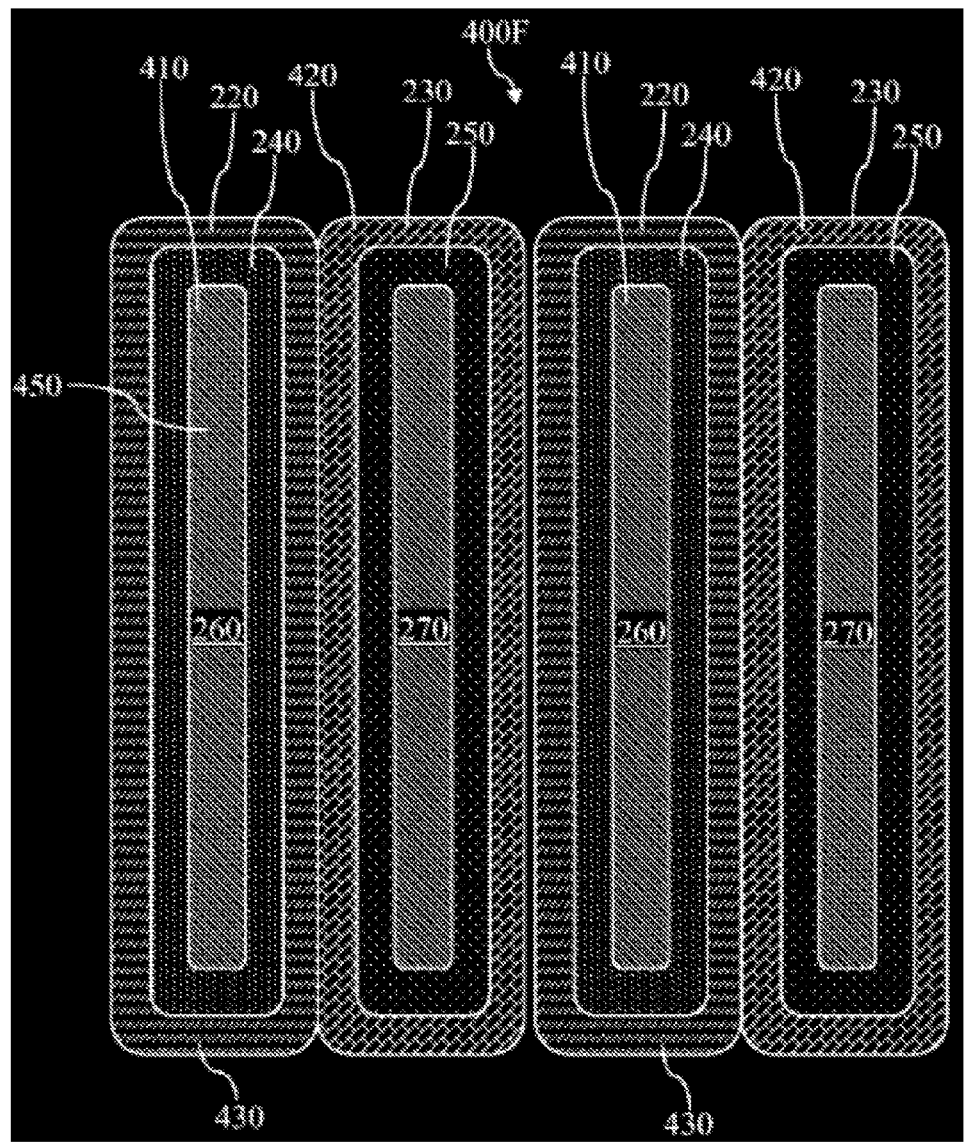
FIG. 17 is a simplified top view of a semiconductor device according to various aspects of the present disclosure.

FIG. 17 is a diagrammatic fragmentary top view of a portion of an ESD protection device 400E according to another embodiment of the present disclosure. The ESD protection device 400E is similar to the ESD protection device 400A, except that there are no heavily doped regions 450. Therefore, the base component 430 is electrically floating in the embodiment shown in FIG. 17. Thus, the embodiment shown in FIG. 17 may be referred to as an ESD protection device having a "floating" base.

Figure 18:
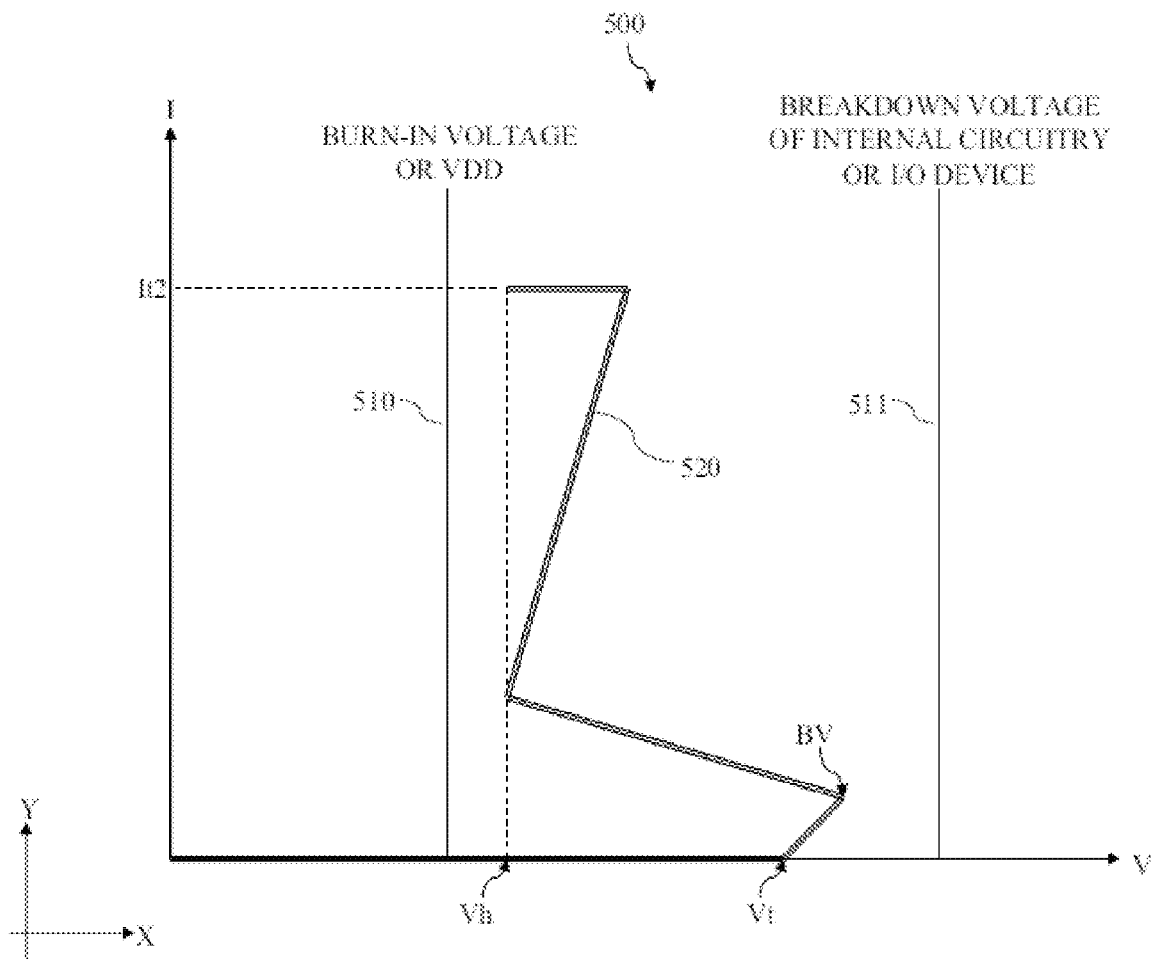
FIG. 18 is a graph illustrating the I-V relationships of various types of ESD protection devices.

FIG. 18 is a graph 500 illustrating an I-V behavior of some conventional breakdown mode ESD protection devices. It is understood, however, that not all conventional breakdown mode ESD protection devices will exhibit the behavior illustrated in FIG. 18, and FIG. 18 is merely a simplified example of the behavior of some conventional breakdown mode ESD protection devices.

Referring to FIG. 18, the graph 500 contains an X-axis (representing voltage) and a Y-axis (representing current). Two vertical lines 510 and 511 represent a burn-in voltage and a breakdown voltage of internal IC circuitry, respectively. These two voltages may be considered specification limits that should not be exceeded. The I-V behavior of a conventional ESD protection device is graphed on the chart as a plot curve 520. The plot curve 520 contains the holding voltage Vh, the turn-on voltage Vt (also referred to as threshold voltage), and the breakdown voltage (for the ESD protection device) BV. As the graph 500 illustrates, the ESD protection device remains turned off until the turn-on voltage Vt is exceeded. Thus, as voltage increases, current increases as well. The ESD protection device enters a breakdown mode when the breakdown voltage BV is exceeded, and then, ESD device turn on At the holding voltage, the I-V curve as a positive slope again, thus as voltage increases, current increases rapidly again until it reaches the current limit at It2.

One problem of conventional ESD protection devices is the divergence between the voltages Vh, Vt, and BV. Since the difference in value between these voltages may be substantial, there is a chance that one of them may dip below the burn-in voltage or exceed the breakdown voltage of the internal circuitry. Stated differently, the wide divergence between the holding voltage, the turn-on voltage, and the breakdown voltage of the ESD protection device means that the ESD protection device may violate or fall outside one or more of the specification limits, which is undesirable and may result in failure or damage to the IC chip. In addition, the burn-in voltage, breakdown voltage, and the holding voltage may vary from device to device as well. Thus, even if one device passes the specification (within the specification limits), the other devices may still fall outside the specification limits. Furthermore, if VDD happens to be greater than the holding voltage Vh, undesirable latch-up may occur.

Figure 19:
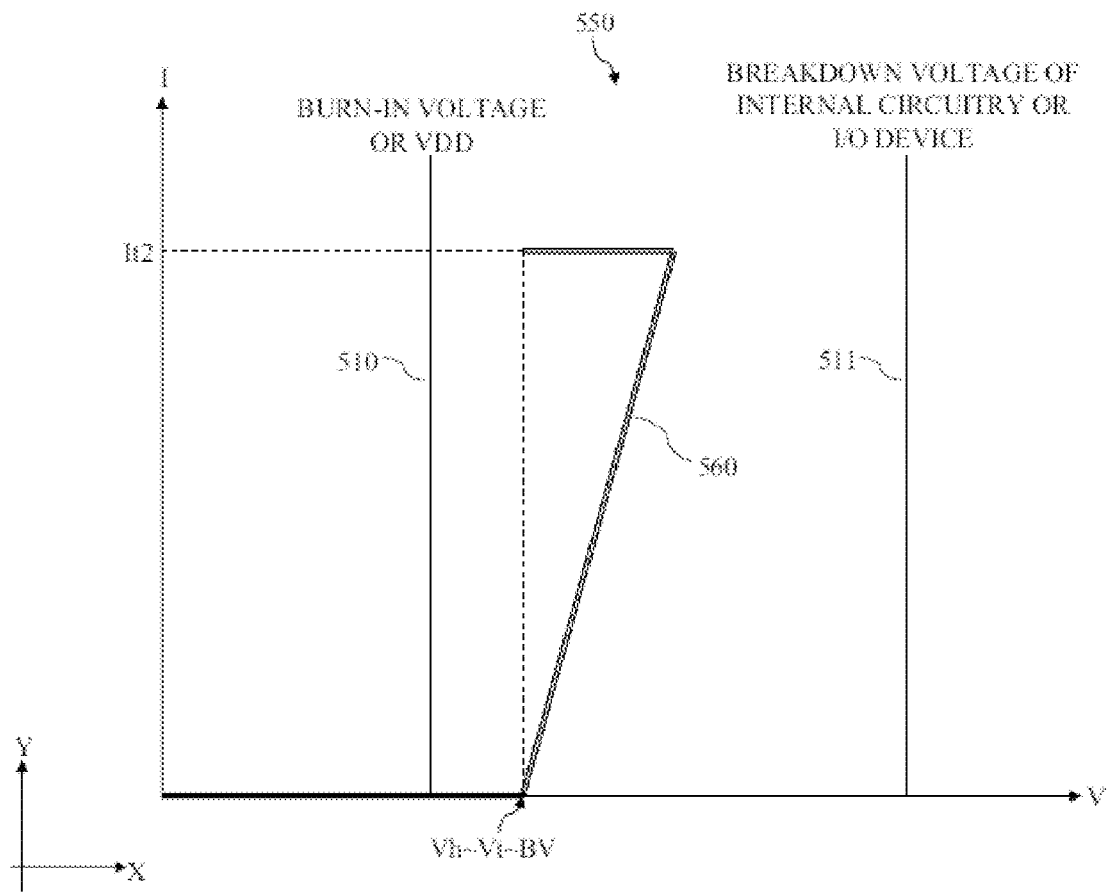
FIG. 19 is a graph illustrating the I-V relationships of various types of ESD protection devices.

Referring to FIG. 19, a graph 550 is provided, which illustrates the I-V behavior for an example ESD protection device fabricated according to various aspects of the present disclosure. The graph 550 still shows the burn-in voltage 510 and the breakdown voltage of the internal IC circuitry 511 as the specification limits. The I-V behavior of the ESD protection device is shown as a plot curve 560. As can be seen, by tuning the layout parameters (e.g., distances 300 and 310, shown in FIG. 2), the difference between the holding voltage Vh, breakdown voltage BV, and the turn-on voltage Vt is substantially minimized. In other words, the voltages Vh, BV, and Vt may be substantially equal to one another. Therefore, it is much easier to control the behavior of the ESD protection device to make sure that all of these voltages Vh, Vt, and BV fall within the specification limits—since if one of them falls within the specification limits, the other ones are most likely within the specification limits too. In this manner, the tuning range of the ESD protection device is drastically increased. The tuning range for the voltages Vh, Vt, and BV is now almost as wide as the difference between the specification limits 510 and 511. The undesirable variance between different types of devices is also unlike to cause failure due to the increased tuning range. In addition, if Vh is tuned to be greater than VDD, that will substantially eliminate the latch-up problems.

According to an aspect of the instant disclosure, an electrostatic discharge (ESD) device is provided. The ESD device comprises a first doped region formed within a substrate upon which the ESD device is formed. The ESD device comprises a second doped region within the substrate, such that current flows from the second doped region to the first doped region during an ESD event. The ESD device comprises a dielectric isolation structure formed between the first doped region and the second doped region. The dielectric isolation structure is formed at a depth that is less than at least one of a first depth of the first doped region or a second depth of the second doped region. During the ESD event, the current flows from the second doped region, substantially under the dielectric isolation structure, to the first doped region. Because the dielectric isolation structure is formed at a relatively shallower depth than the first doped region or the second doped region, the current flows along a relatively shorter path having a lower resistance, which enables the ESD device to carry a higher current during the ESD event before failure.

According to an aspect of the instant disclosure, an apparatus comprising an electrostatic (ESD) device is provided. The ESD device comprises a collector formed within a substrate upon which the ESD device is formed. The collector comprises a first doped region that is doped according to a first doping polarity. The ESD device comprises an emitter formed within the substrate. The emitter comprises a second doped region that is doped according to the first doping polarity. The ESD device comprises a dielectric isolation structure formed between the collector and the emitter. The dielectric isolation structure comprises a resist protective (RPO) layer that is configured to provide isolation between the collector and the emitter. In an embodiment, the RPO layer is formed to a depth that is less than at least one of a first depth of the first doped region of the collector or a second depth of the second doped region of the emitter. During an ESD event, current flows from the emitter, substantially under the RPO layer, to the collector. In an embodiment, because the RPO layer is formed at a relatively shallower depth than at least one of the emitter or the collector, the current flows along a relatively shorter path having a lower resistance, which enables the ESD device to carry a higher current during the ESD event before failure.

According to an aspect of the instant disclosure, an apparatus comprising an electrostatic (ESD) device is provided. The ESD device comprises a collector formed within a substrate upon which the ESD device is formed. The collector comprises a first doped region that is doped according to a first doping polarity. The ESD device comprises an emitter formed within the substrate. The emitter comprises a second doped region that is doped according to the first doping polarity. The ESD device comprises a dielectric isolation structure formed on top of a surface of the substrate. The dielectric isolation layer is configured to provide isolation between the collector and the emitter. During an ESD event, current flows from one of the terminals, substantially under the dielectric isolation layer, to another terminal. Because the dielectric isolation structure is formed at a relatively shallower depth than at least one of the emitter or the collector, the current flows along a relatively shorter path having a lower resistance, which enables the ESD device to carry a higher current during the ESD event before failure.

One of the broader forms of the present disclosure involves an apparatus. The apparatus includes a BJT device. The BJT device includes: a collector disposed in a substrate, the collector including: a first doped element and a second doped element disposed over the first doped element, wherein the first and second doped elements each have a first doping polarity, and wherein the second doped element has a greater doping concentration level than the first doped element; a base disposed in the substrate and adjacent to the collector, the base including: a third doped element having a second doping polarity different from the first doping polarity, wherein a p-n junction is formed between the third doped element and one of the first and second doped elements; and an emitter disposed over the base, the emitter including a fourth doped element having the first doping polarity, wherein the fourth doped element has a greater doping concentration level than the third doped element.

Another one of the broader forms of the present disclosure involves an ESD protection device. The ESD protection device includes: a substrate; a collector component of a bipolar junction transistor (BJT) device formed in the substrate, wherein the collector component is progressively doped in a manner such that a portion of the collector component closer to the surface of the substrate is more heavily doped than a portion of the collector component further away from the surface of the substrate; a base component of the BJT device formed in the substrate, the base component forming a first p-n junction with the collector component; and an emitter component of the BJT device formed on the base component, the emitter component forming a second p-n junction with the base component; wherein the base component is oppositely doped from the collector component and the emitter component.

Another one of the broader forms of the present disclosure involves an ESD protection device. The ESD protection device includes a BJT device. The BJT device includes: a bipolar junction transistor (BJT) device, the BJT device including: a first p-n interface formed by a collector of the BJT device and a base of the BJT device, the collector including a plurality of doped features all having the same doping polarity but different doping concentration levels, the base being laterally disposed with respect to the collector and including one or more doped features; and a second p-n interface formed by the base and an emitter of the BJT device, the emitter being vertically disposed with respect to the base and including a doped feature formed above the base, the emitter having a greater doping concentration level than the base therebelow; wherein: the doped features of the base are of an opposite doping polarity from the doped features of the collector and the emitter; and a turn-on voltage, a breakdown voltage, and a holding voltage of the BJT device are each correlated with a layout parameter of the BJT device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A bipolar junction transistor (BJT) device, comprising:
   a collector disposed in a substrate, the collector comprising:
      a first doped element having a first doping polarity;
      a second doped element having the first doping polarity, an exterior sidewall of the second doped element in contact with an interior sidewall of the first doped element; and
      a third doped element having the first doping polarity, an exterior sidewall of the third doped element in contact with an interior sidewall of the second doped element; wherein the second doped element has a greater doping concentration level than the first doped element and the third doped element has a greater doping concentration level than the second doped element;
   a base disposed in the substrate and adjacent to the collector, the base comprising:

a fourth doped element having a second doping polarity;
an emitter disposed over the base, the emitter comprising:
a fifth doped element having the first doping polarity, wherein the fifth doped element has a greater doping concentration level than the fourth doped element; and
an isolation structure disposed between the collector and the emitter.

2. The BJT device of claim 1, wherein a bottom surface of the isolation structure is substantially co-planar with a top surface of at least one of the third doped element or the fifth doped element.

3. The BJT device of claim 1, wherein at least one of the third doped element or the fifth doped element have a greater depth than the isolation structure.

4. The BJT device of claim 3, wherein a top surface of the isolation structure is substantially co-planar with a top surface of at least one of the third doped element or the fifth doped element.

5. The BJT device of claim 1, the base comprising:
a sixth doped element disposed below the fourth doped element and having the second doping polarity, wherein the fourth doped element has a greater doping concentration level than the sixth doped element.

6. The BJT device of claim 5, an interior sidewall of the sixth doped element in contact with an exterior sidewall of the fourth doped element.

7. The BJT device of claim 5, wherein a p-n junction is formed between the sixth doped element and the first doped element.

8. The BJT device of claim 7, wherein a second p-n junction is formed between the fourth doped element and the fifth doped element.

9. The BJT device of claim 1, wherein a p-n junction is formed between the fourth doped element and the fifth doped element.

10. The BJT device of claim 1, wherein the isolation structure abuts the first doped element, the second doped element, and the fourth doped element.

11. The BJT device of claim 10, wherein:
the base comprises a sixth doped element disposed below the fourth doped element and having the second doping polarity, the fourth doped element having a greater doping concentration level than the sixth doped element; and
the isolation structure abuts the sixth doped element.

12. The BJT device of claim 11, wherein the isolation structure abuts the third doped element and the fifth doped element.

13. The BJT device of claim 1, wherein the isolation structure abuts the third doped element and the fifth doped element.

14. The BJT device of claim 1, wherein the isolation structure is a silicide blocking layer.

15. An electrostatic discharge (ESD) protection device, comprising:
a collector disposed in a substrate, the collector comprising:
a first doped element having a first doping polarity; and
a second doped element having the first doping polarity, a doping concentration level of the second doped element different than a doping concentration level of the first doped element;
a base disposed in the substrate and adjacent to the collector, the base comprising:
a third doped element having a second doping polarity; and a fourth doped element having the second doping polarity, a doping concentration level of the fourth doped element different than a doping concentration level of the third doped element;
an emitter disposed over the base, the emitter comprising:
a fifth doped element having the first doping polarity; and
an isolation structure in contact with the collector, the base, and the emitter, wherein:
a top surface of the substrate lies in a first plane, and
the third doped element, the fourth doped element, and the fifth doped element are coincident with a second plane parallel to the first plane.

16. The ESD protection device of claim 15, wherein the collector comprises a sixth doped element having the first doping polarity, wherein the sixth doped element has a greater doping concentration level than the first doped element and the second doped element.

17. The ESD protection device of claim 15, wherein the isolation structure is in contact with the first doped element, the second doped element, the third doped element, and the fourth doped element.

18. The ESD protection device of claim 15, wherein a bottom surface of the isolation structure is substantially co-planar with a top surface of the collector and a top surface of the emitter.

19. The ESD protection device of claim 15, wherein:
the fifth doped element has a greater depth than the isolation structure; and
wherein a top surface of the isolation structure is substantially co-planar with a top surface of the third doped element.

20. An electrostatic discharge (ESD) protection device, comprising:
a collector disposed in a substrate, the collector comprising:
a first doped element having a first doping polarity;
a second doped element having the first doping polarity; and
a third doped element having the first doping polarity, wherein:
the second doped element has a greater doping concentration level than the first doped element and the third doped element has a greater doping concentration level than the second doped element,
a top surface of the substrate lies in a first plane, and
the first doped element, the second doped element, and the third doped element are coincident with a second plane parallel to the first plane;
a base disposed in the substrate and adjacent to the collector, the base comprising:
a fourth doped element having a second doping polarity;
an emitter disposed over the base, the emitter comprising:
a fifth doped element having the first doping polarity, wherein the fifth doped element has a greater doping concentration level than the fourth doped element; and
an isolation structure in contact with the collector, the base, and the emitter.

21. The electrostatic discharge (ESD) protection device of claim 20, wherein:
the base comprises a sixth doped element having the second doping polarity,
the fourth doped element, the fifth doped element, and the sixth doped element are coincident with the second plane, and the fourth doped element having a greater doping concentration level than the sixth doped element.

22. The electrostatic discharge (ESD) protection device of claim 21, the isolation structure in contact with the first doped element, the second doped element, the third doped element, the fourth doped element, the fifth doped element, and the sixth doped element.

23. The electrostatic discharge (ESD) protection device of claim 20, wherein a bottom surface of the isolation structure is substantially co-planar with a top surface of at least one of the third doped element or the fifth doped element.

* * * * *